United States Patent
Ye et al.

(10) Patent No.: US 8,732,625 B2
(45) Date of Patent: May 20, 2014

(54) METHODS FOR PERFORMING MODEL-BASED LITHOGRAPHY GUIDED LAYOUT DESIGN

(75) Inventors: Jun Ye, Palo Alto, CA (US); Yu Cao, Cupertino, CA (US); Hanying Feng, Fremont, CA (US)

(73) Assignee: ASML Netherlands B.V., Veldhoven (NL)

( * ) Notice: Subject to any disclaimer, the term of this patent is extended or adjusted under 35 U.S.C. 154(b) by 880 days.

(21) Appl. No.: 12/663,121

(22) PCT Filed: Jun. 3, 2008

(86) PCT No.: PCT/US2008/065656
§ 371 (c)(1),
(2), (4) Date: Dec. 4, 2009

(87) PCT Pub. No.: WO2008/151185
PCT Pub. Date: Dec. 11, 2008

(65) Prior Publication Data
US 2010/0203430 A1    Aug. 12, 2010

Related U.S. Application Data

(60) Provisional application No. 60/935,713, filed on Aug. 28, 2007.

(51) Int. Cl.
*G06F 17/50* (2006.01)
(52) U.S. Cl.
USPC .............................................. 716/50; 716/55
(58) Field of Classification Search
USPC ..................................................... 716/50–55
See application file for complete search history.

(56) References Cited

U.S. PATENT DOCUMENTS 5,229,872 A    7/1993    Mumola
5,296,891 A    3/1994    Vogt
(Continued)

FOREIGN PATENT DOCUMENTS

CN    1573554    2/2005
CN    1664702    9/2005
(Continued)

OTHER PUBLICATIONS

Chinese Office Action dated Jun. 20, 2011 in corresponding Chinese Patent Application No. 200880018349.0.
(Continued)

*Primary Examiner* — Binh Tat
(74) *Attorney, Agent, or Firm* — Pillsbury Winthrop Shaw Pittman LLP

(57) ABSTRACT

Methods are disclosed to create efficient model-based Sub-Resolution Assist Features (MB-SRAF). An SRAF guidance map is created, where each design target edge location votes for a given field point on whether a single-pixel SRAF placed on this field point would improve or degrade the aerial image over the process window. In one embodiment, the SRAF guidance map is used to determine SRAF placement rules and/or to fine-tune already-placed SRAFs. The SRAF guidance map can be used directly to place SRAFs in a mask layout. Mask layout data including SRAFs may be generated, wherein the SRAFs are placed according to the SRAF guidance map. The SRAF guidance map can comprise an image in which each pixel value indicates whether the pixel would contribute positively to edge behavior of features in the mask layout if the pixel is included as part of a sub-resolution assist feature.

16 Claims, 12 Drawing Sheets

(56) References Cited

U.S. PATENT DOCUMENTS

| | | | |
|---|---|---|---|
| 5,523,193 A | 6/1996 | Nelson | |
| 5,969,441 A | 10/1999 | Loopstra et al. | |
| 6,042,792 A | 3/2000 | Shefer et al. | |
| 6,981,235 B1 | 12/2005 | Salowe et al. | |
| 7,147,976 B2 | 12/2006 | Liebmann et al. | |
| 7,247,574 B2 | 7/2007 | Broeke et al. | |
| 7,376,930 B2 | 5/2008 | Wampler et al. | |
| 7,480,891 B2 | 1/2009 | Sezginer | |
| 7,506,300 B2 | 3/2009 | Sezginer et al. | |
| 7,523,435 B2 | 4/2009 | Bollepalli et al. | |
| 7,550,235 B2 | 6/2009 | Shi et al. | |
| 7,552,416 B2 | 6/2009 | Granik et al. | |
| 7,594,199 B2 | 9/2009 | Socha et al. | |
| 7,620,930 B2 | 11/2009 | Van Den Broeke et al. | |
| 7,882,480 B2 * | 2/2011 | Ye et al. | 716/53 |
| 8,037,429 B2 * | 10/2011 | Shang et al. | 716/53 |
| 2004/0229133 A1 | 11/2004 | Socha et al. | |
| 2005/0053848 A1 | 3/2005 | Wampler et al. | |
| 2005/0142449 A1 | 6/2005 | Shi et al. | |
| 2005/0149900 A1 | 7/2005 | Laidig et al. | |
| 2005/0149902 A1 | 7/2005 | Shi et al. | |
| 2005/0185159 A1 | 8/2005 | Rosenbluth et al. | |
| 2005/0273753 A1 | 12/2005 | Sezginer et al. | |
| 2006/0075377 A1 | 4/2006 | Van Den Broeke et al. | |
| 2006/0200790 A1 | 9/2006 | Shang et al. | |
| 2006/0236294 A1 | 10/2006 | Saidin et al. | |
| 2006/0248495 A1 | 11/2006 | Sezginer | |
| 2006/0269875 A1 * | 11/2006 | Granik | 430/311 |
| 2006/0291714 A1 | 12/2006 | Wu et al. | |
| 2007/0101310 A1 * | 5/2007 | Stirniman et al. | 716/21 |
| 2007/0198963 A1 * | 8/2007 | Granik et al. | 716/19 |
| 2008/0008972 A1 | 1/2008 | Muelders et al. | |
| 2008/0301620 A1 * | 12/2008 | Ye et al. | 716/19 |

FOREIGN PATENT DOCUMENTS

| | | |
|---|---|---|
| EP | 2 439 420 | 7/2004 |
| JP | H09-34098 | 2/1997 |
| JP | 2004-221594 | 8/2004 |
| JP | 2004-266269 | 9/2004 |
| JP | 2005-025210 | 1/2005 |
| JP | 2005-141241 | 6/2005 |
| JP | 2005-183981 | 7/2005 |
| JP | 2006-065338 | 3/2006 |
| TW | 564359 | 12/2003 |
| TW | 200604865 | 2/2006 |
| TW | 200634509 | 10/2006 |

OTHER PUBLICATIONS

Japanese Office Action mailed Jun. 19, 2012 in corresponding Japanese Patent Application No. 2010-511279.

International Search Report issued Oct. 7, 2008 in corresponding PCT/US2008/065656.

Cao, et al., "Optimized Hardware and Software for Fast, Full Chip Simulation", Optical Microlithography XVIII, Proc. of SPIE, vol. 5754, 2005.

Cobb, et al., "Dense OPC for 65nm and Below", 25th Annual BACUS Symp. On Photomask Technology, Proc. of SPIE, vol. 5992, 599259 (2005).

Martin, et al., "Exploring New High Speed, Mask Aware RET Verification Flows", Photomask and Next Generation Lithography Mask Technology XII, Proc. Of SPIE, vol. 5853, 2005.

Spence, et al. "Full chip Lithography Simulation and Design Analysis—How OPC is Changing IC Design", Emerging Lithographic Technologies IX, Proc. Of SPIE, vol. 5751, 2005.

Japanese Office Action dated Mar. 4, 2014 in corresponding Japanese Patent Application No. 2013-133377.

* cited by examiner

METHODS FOR PERFORMING MODEL-BASED LITHOGRAPHY GUIDED LAYOUT DESIGN

CROSS REFERENCE TO RELATED APPLICATIONS

This application is the U.S. National Stage Application (filed under 35 U.S.C. 371) of prior International Application No. PCT/US2008/065656, filed Jun. 3, 2008, and published on Dec. 11, 2008 as WO 2008/151185, which claims the benefit of/priority to U.S. application Ser. No. 11/757,805, filed Jun. 4, 2007, entitled "System and Method for Model-Based Sub-Resolution Assist Feature Generation", issued on Feb. 1, 2011 as U.S. Pat. No. 7,882,480, and also claims the benefit of/priority to U.S. provisional application No. 60/935,713, filed Aug. 28, 2007.

FIELD OF THE INVENTION

This invention relates generally to resolution enhancement techniques for photolithography and relates more particularly to a system and method for model-based lithography guided layout.

BACKGROUND

Lithographic apparatus can be used, for example, in the manufacture of integrated circuits (ICs). In such a case, the mask may contain a circuit pattern corresponding to an individual layer of the IC, and this pattern can be imaged onto a target portion (e.g. comprising one or more dies) on a substrate (silicon wafer) that has been coated with a layer of radiation-sensitive material (resist). In general, a single wafer will contain a whole network of adjacent target portions that are successively irradiated via the projection system, one at a time. In one type of lithographic projection apparatus, each target portion is irradiated by exposing the entire mask pattern onto the target portion in one go; such an apparatus is commonly referred to as a wafer stepper. In an alternative apparatus, commonly referred to as a step-and-scan apparatus, each target portion is irradiated by progressively scanning the mask pattern under the projection beam in a given reference direction (the "scanning" direction) while synchronously scanning the substrate table parallel or anti-parallel to this direction. Since, in general, the projection system will have a magnification factor M (generally <1), the speed V at which the substrate table is scanned will be a factor M times that at which the mask table is scanned. More information with regard to lithographic devices as described herein can be gleaned, for example, from U.S. Pat. No. 6,046,792, incorporated herein by reference.

In a manufacturing process using a lithographic projection apparatus, a mask pattern is imaged onto a substrate that is at least partially covered by a layer of radiation-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g., an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc.

For the sake of simplicity, the projection system may hereinafter be referred to as the "lens"; however, this term should be broadly interpreted as encompassing various types of projection systems, including refractive optics, reflective optics, and catadioptric systems, for example. The radiation system may also include components operating according to any of these design types for directing, shaping or controlling the projection beam of radiation, and such components may also be referred to below, collectively or singularly, as a "lens". Further, the lithographic apparatus may be of a type having two or more substrate tables (and/or two or more mask tables). In such "multiple stage" devices the additional tables may be used in parallel, or preparatory steps may be carried out on one or more tables while one or more other tables are being used for exposures. Twin stage lithographic apparatus are described, for example, in U.S. Pat. No. 5,969,441, incorporated herein by reference.

The photolithographic masks referred to above comprise geometric patterns corresponding to the circuit components to be integrated onto a silicon wafer. The patterns used to create such masks are generated utilizing CAD (computer-aided design) programs, this process often being referred to as EDA (electronic design automation). Most CAD programs follow a set of predetermined design rules in order to create functional masks. These rules are set by processing and design limitations. For example, design rules define the space tolerance between circuit devices (such as gates, capacitors, etc.) or interconnect lines, so as to ensure that the circuit devices or lines do not interact with one another in an undesirable way. The design rule limitations are typically referred to as "critical dimensions" (CD). A critical dimension of a circuit can be defined as the smallest width of a line or hole or the smallest space between two lines or two holes. Thus, the CD determines the overall size and density of the designed circuit. Of course, one of the goals in integrated circuit fabrication is to faithfully reproduce the original circuit design on the wafer (via the mask).

The integrated circuit industry has, since its inception, maintained a remarkable growth rate by driving increased device functionality at lower cost. One of the primary enabling factors of this growth has been the ability of optical lithography to steadily decrease the smallest feature size that can be formed as part of the integrated circuit pattern. The steady decline in feature size and cost and the corresponding increase in the density of features printed per circuit are commonly referred to as "Moore's Law" or the lithography "roadmap."

The lithography process involves creating a master image on a mask or reticle (mask and reticle are used interchangeably herein), then projecting an image from the mask onto a resist-covered semiconductor wafer in order to create a pattern that matches the design intent of defining functional elements, such as transistor gates, contacts etc., on the wafer. The more times a master pattern is successfully replicated on a wafer within the design specifications, the lower the cost per finished device or "chip" will be. Until recently, the mask pattern has been an almost exact duplicate of the desired pattern at the wafer level, with the exception that the mask level pattern may be several times larger than the wafer level pattern, due to an imaging reduction ratio of the exposure tool. The mask is typically formed by depositing and patterning a light absorbing material on quartz or another transparent substrate. The mask is then placed in an exposure tool known as a "stepper" or "scanner" where light of a specific exposure wavelength is directed through the mask onto the wafers. The light is transmitted through clear areas of the mask, but is attenuated by a desired amount, typically between 90 and 100%, in the areas covered by the absorbing layer. The light that passes through some regions of the mask may also be phase shifted by a desired phase angle, typically an integer multiple of 180 degrees. After being collected by the projection optics of the exposure tool, the resulting aerial image pattern is then focused onto the wafers. A light-sensitive material (photoresist or resist) deposited on the wafer surface interacts with the light to form the desired pattern on the wafer, and the pattern is then transferred into the underlying layers on the wafer to form functional electrical circuits according to well-known processes.

In recent years, the feature sizes being patterned have become significantly smaller than the wavelength of light used to transfer the mask pattern onto the wafer. This trend towards "sub-wavelength lithography" has resulted in increasing difficulty in maintaining adequate process margins in the lithography process. The aerial images created by the mask and exposure tool lose contrast and sharpness as the ratio of feature size to wavelength decreases. This ratio is quantified by the $k_1$ factor, defined as the numerical aperture (NA) of the exposure tool times the minimum feature size $W_f$ divided by the wavelength $\lambda$, i.e., $k_1 = NA \cdot W_f/\lambda$. There is limited practical flexibility in choosing the exposure wavelength, while the numerical aperture of exposure tools is approaching physical limits. Consequently, the continuous reduction in device feature sizes requires more and more aggressive reduction of the $k_1$ factor in lithographic processes, i.e. imaging at or below the classical resolution limits of an optical imaging system.

New methods to enable low-$k_1$ lithography have used master patterns on the mask that are no longer exact copies of the final wafer level pattern. The mask pattern is often adjusted in terms of the size and placement of pattern features as a function of pattern density or pitch. Other techniques involve the addition or subtraction of extra corners on the mask pattern ("serifs," "hammerheads," and other patterns) known as Optical Proximity Correction, or OPC; and the addition of other geometries that are not intended to be replicated on the wafer at all. The sole purpose of these non-printing "assist features," also known as Sub-Resolution Assisting Features (SRAFs) or scattering bars, is to enhance the printability of the "main features." The SRAFs are typically small bars placed close to the main features so that the printability of the main features is more robust against focus and/or dose change. All of these methods are often referred to collectively as Resolution Enhancement Technology (RET). With decreasing $k_1$, the magnitude of proximity effects increases dramatically. In current high-end designs, more and more device layers require RET, and almost every feature edge requires some amount of adjustment to ensure that the printed pattern will reasonably resemble the design intent. The implementation and verification of such extensive RET application is only made possible by detailed full-chip computational lithography process modeling, and the process is generally referred to as model-based RET. (See "Full-Chip Lithography Simulation and Design Analysis—How OPC Is Changing IC Design," C. Spence, Proc. SPIE, Vol. 5751, pp. 1-14 (2005) and "Exploring New High Speed, Mask Aware RET Verification Flows," P. Martin et al., Proc. SPIE 5853, pp. 114-123, (2005)).

The cost of manufacturing advanced mask sets is steadily increasing. Currently, the cost has already exceeded one million dollars per mask set for an advanced device. In addition, the turn-around time is always a critical concern. As a result, lithography-driven RET design, which assists in reducing both the cost and turn-around time, has become an integral part of the semiconductor manufacturing process.

FIG. 1 is a flowchart of a prior art method for applying resolution enhancement techniques to a design layout. In step 110, a design layout that describes the shapes and sizes of patterns that correspond to functional elements of a semiconductor device, such as diffusion layers, metal traces, contacts, and gates of field-effect transistors, is obtained. These patterns represent the "design intent" of physical shapes and sizes that need to be reproduced on a wafer by the lithography process in order to achieve certain electrical functionality and specifications of the final device. The design layout is also referred to as the "pre-RET" layout or target pattern As described above, numerous modifications to this design layout are required to create the patterns on the mask or reticle used to print the desired structures. In step 112, a variety of RET methods are applied to the design layout in order to approximate the design intent in the actually printed patterns. The resulting "post-RET" mask layout often differs significantly from the "pre-RET" design layout. Both the Pre- and Post-RET layouts may be provided to the lithography simulation system in a polygon-based hierarchical data file, for example, but not limited to, the GDS or the OASIS format.

In step 114, as one example, resist contours on the wafer are simulated using the post-RET layout and a model of the lithography process. This model includes an optical model component that describes the transformation from the post-RET layout to an aerial image (AI) and a resist model component that describes the transformation from the AI to the final resist image (RI). In step 116, the simulated resist contours are extracted from the RI and compared to the target design layout, and in step 118 it is determined whether the simulated resist contours are acceptable (i.e., within a predefined error tolerance). If they are not acceptable, then the method returns to step 112 where another iteration of RET methods are applied to the pre-RET layout. If the simulated resist contours are acceptable, then the post-RET layout is output and used to manufacture an actual mask (Step 120).

A central part of lithography simulation is the optical model component of the model of the lithography process, which simulates the projection and image forming process in the exposure tool. The optical model needs to incorporate critical parameters of the illumination and projection system, such as but not limited to, numerical aperture and partial coherence settings, illumination wavelength, illuminator source shape, and possibly imperfections of the system such as aberrations or flare. The projection system and various optical effects, e.g., high-NA diffraction, scalar or vector, polarization, and thin-film multiple reflection, may be modeled utilizing transmission cross coefficients (TCCs). The TCCs may be decomposed into convolution kernels, using an eigen-series expansion. For computation speed, the series is usually truncated based on the ranking of eigen-values, resulting in a finite set of kernels. The more kernels that are kept, the less error is introduced by the truncation. The lithography simulation system described in U.S. Pat. No. 7,003,758, which is hereby incorporated herein in its entirety, allows for optical simulations using a very large number of convolution kernels without negative impact on computation time and therefore enables highly accurate optical modeling.

As the lithography process entered below the 65 nm node, leading-edge chip designs have minimum feature sizes smaller than the wavelength of light used in advanced exposure tools. Sub-resolution assist features (SRAFs) become indispensable even if OPC techniques provide good results. Typically, OPC will modify the design layout so that a resist image (RI) contour is close enough to the design target at nominal condition. However, the Process Window (PW) is rather small without any extra features. SRAFs are needed to enhance the printability of the main features across a wider range of defocus and delta dose scenarios in order to maintain adequate process margins in the lithography process.

For the layout itself, the relative position of main feature patterns are also playing an important role in the PW size. For example, for 1-dimensional patterns, designs must avoid forbidden pitches, which are a period of repetitive patterns that result in very low printability. For certain forbidden pitches, no SRAF or OPC can help yield desirable PW. For 1-dimensional patterns (such as a line and space pattern), it is relatively easy to determine a set of rules to avoid a forbidden pitch in the layout design. However, a typical chip design consists of many patterns with complicated 2-dimensional geometric shapes and no simple rules can provide a design which avoids bad placement of layout (for example, due to a forbidden pitch) and also makes efficient use of the space.

Accordingly, there is a strong need for a method and/or process for improving the mask formation process so as to further improve the resulting imaging performance, beyond the corrections available utilizing known OPC techniques, which can accommodate complicated and different 2-dimensional target patterns.

SUMMARY

In view of the foregoing, the present invention relates to a model-based approach for determining the preferred location of the main or target features (i.e., features to be imaged) within the mask layout. In general, the method of the present invention performs an iterative process in which one or more target features are placed in the mask design and then a simulation process is performed, for example, but not limited to, the generation of a SRAF Guidance Map (SGM) as described in U.S. Pat. No. 7,882,480, and the SGM is then utilized to assist in the determination of the optimal location for the next target feature to be placed in the mask design. Once one or more additional features are placed in the mask design, another simulation process is run utilizing all of the features currently in the mask design, and then the results of this simulation is utilized to place additional features in the mask design. This reiterative simulation and feature placement process is continued until all of the features have been placed in the mask design. The foregoing process is referred to herein as a model-based lithography guided layout (LGL). Once design completed, the mask can then be subjected to OPC and RET treatments. It is noted that the amount that a given feature may be moved or repositioned within the mask layout is typically determined by the design rules governing the overall mask layout.

More specifically, the model-based LGL method of the present invention includes the generation of a plurality of Layout Guidance Maps (LGM). Each LGM, which is generated utilizing a suitable simulation model, represents the imaging performance for the associated mask utilized to generate the given LGM. In one embodiment, the LGM is a two-dimensional (2D) image represented by pixel values which correspond to the imaging performance of the given mask, where each pixel value of the LGM indicates whether the given pixel is suitable for the placement of new line or feature (i.e., pattern): the higher the pixel value, the more contribution to the printability of existing patterns if new pattern is placed on this pixel; the lower the pixel value, the more negative adversary impact to the printability of existing patterns if new pattern is placed on this pixel. In other words, once the LGM is generated for the given mask, the areas where new features are to be placed are analyzed via the LGM to determine if a feature placed at this new location would enhance the printing of the features already present in the mask, or would negatively affect the printing of the features already present in the mask. If the former, the new feature is placed at the indicated location, and if the latter, it is then determined if it is possible to shift the placement of the new feature (within the allowable limits) such that the feature enhances the imaging of the features present in the mask, or at least reduce the negative impact on printing. Once this is completed, the new features under consideration are added to the mask design, and a new LGM (i.e., simulation) is run for the mask modified to include the new features, and then the process is repeated for the next feature (or set of features) to be added to the mask. As noted, this process is repeated until all target features have been processed.

In accordance with the LGL process, the LGM is optimized for process window and through focus and through delta dose. The LGM also allows edge point by edge point weighting, thereby allowing for critical main feature optimization. In one embodiment of the present invention, the LGM is computed in the same manner as the SRAF Guidance Map (SGM) disclosed in U.S. Pat. No. 7,882,480. However, any suitable simulation model capable of simulating the imaging process may be utilized in the process of the present invention. In another embodiment, the LGM can be formed utilizing an interference map such as is disclosed in U.S. Pat. No. 7,247,574, which is hereby incorporated herein in its entirety.

As noted above, in one embodiment of the process of the present invention, the placement of the patterns forming the target pattern within the mask design are addressed in a sequential manner. Specifically, in each iteration, one or a few main patterns are placed in the mask design and a new SGM for all existing patterns (i.e., those already placed in the mask design) is computed. This SGM yields information on the best or worst location for the next main pattern or feature to be placed in the mask design, and these features are then placed in the mask design based on the result of the SGM. This process is repeated all the patterns/features are added to the mask design (i.e., mask layout).

The present invention provides significant advantages over prior art methods. Most importantly, the present invention provides a systematic, fast and cost effective model-based method for optimizing the placement of the main features (i.e., target features) within the mask design. In addition, the present invention improves the Design for Manufacturability (DFM) capabilities over existing processes and can provide for improved process margins in sub-wavelength lithography processes.

Although specific reference may be made in this text to the use of the invention in the manufacture of ICs, it should be explicitly understood that the invention has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as being replaced by the more general terms "mask", "substrate" and "target portion", respectively.

The terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range 5-20 nm).

The term mask as employed in this text may be broadly interpreted as referring to generic patterning means that can be used to endow an incoming radiation beam with a patterned cross-section, corresponding to a pattern that is to be created in a target portion of the substrate; the term "light valve" can also be used in this context. Besides the classic mask (transmissive or reflective; binary, phase-shifting, hybrid, etc.), examples of other such patterning means include:

- a programmable mirror array. An example of such a device is a matrix-addressable surface having a viscoelastic control layer and a reflective surface. The basic principle behind such an apparatus is that (for example) addressed areas of the reflective surface reflect incident light as diffracted light, whereas unaddressed areas reflect incident light as undiffracted light. Using an appropriate filter, the said undiffracted light can be filtered out of the reflected beam, leaving only the diffracted light behind; in this manner, the beam becomes patterned according to the addressing pattern of the matrix-addressable surface. The required matrix addressing can be performed using suitable electronic means. More information on such mirror arrays can be gleaned, for example, from U.S. Pat. No. 5,296,891 and U.S. Pat. No. 5,523,193, which are incorporated herein by reference.
- a programmable LCD array. An example of such a construction is given in U.S. Pat. No. 5,229,872, which is incorporated herein by reference.

The invention itself, together with further objects and advantages, can be better understood by reference to the following detailed description and the accompanying schematic drawings.

DETAILED DESCRIPTION OF THE INVENTION

Figure 1:
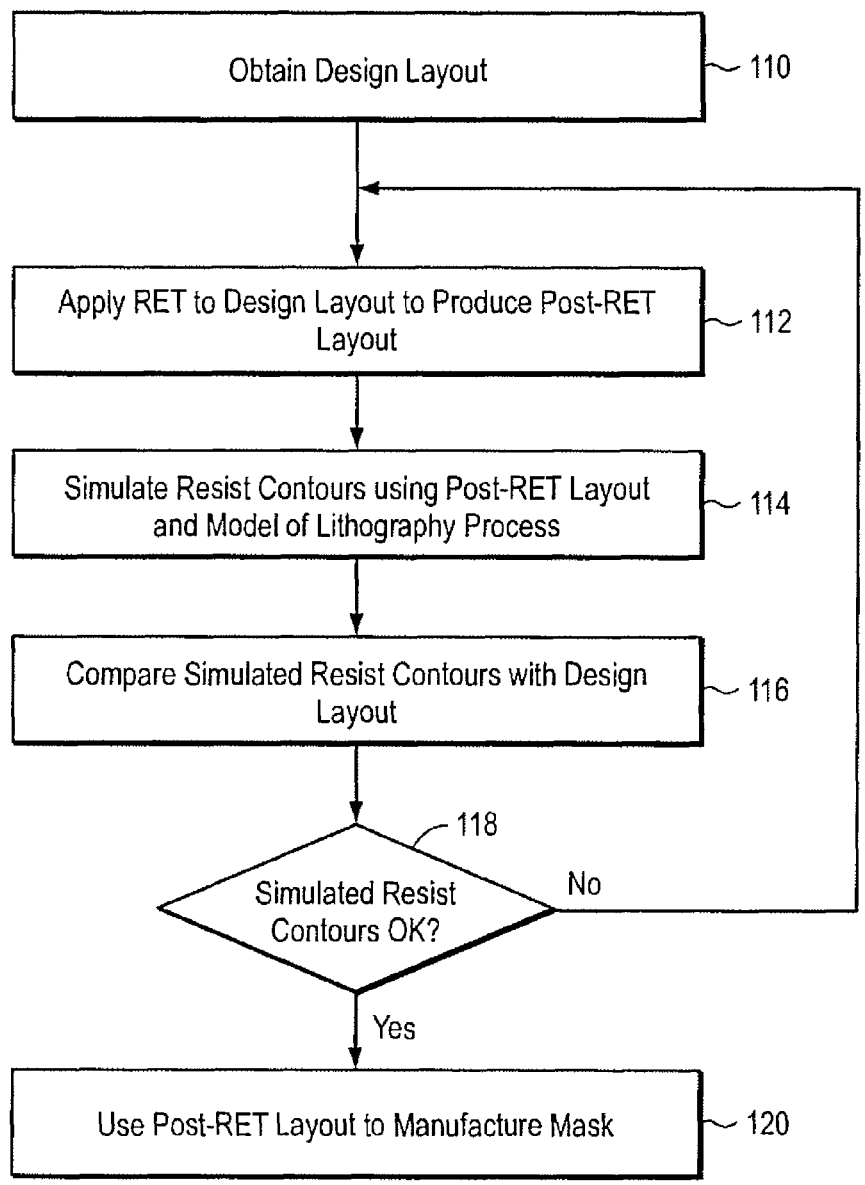
FIG. 1 is a flowchart of a prior art method for applying resolution enhancement techniques to a design layout.
Figure 2:
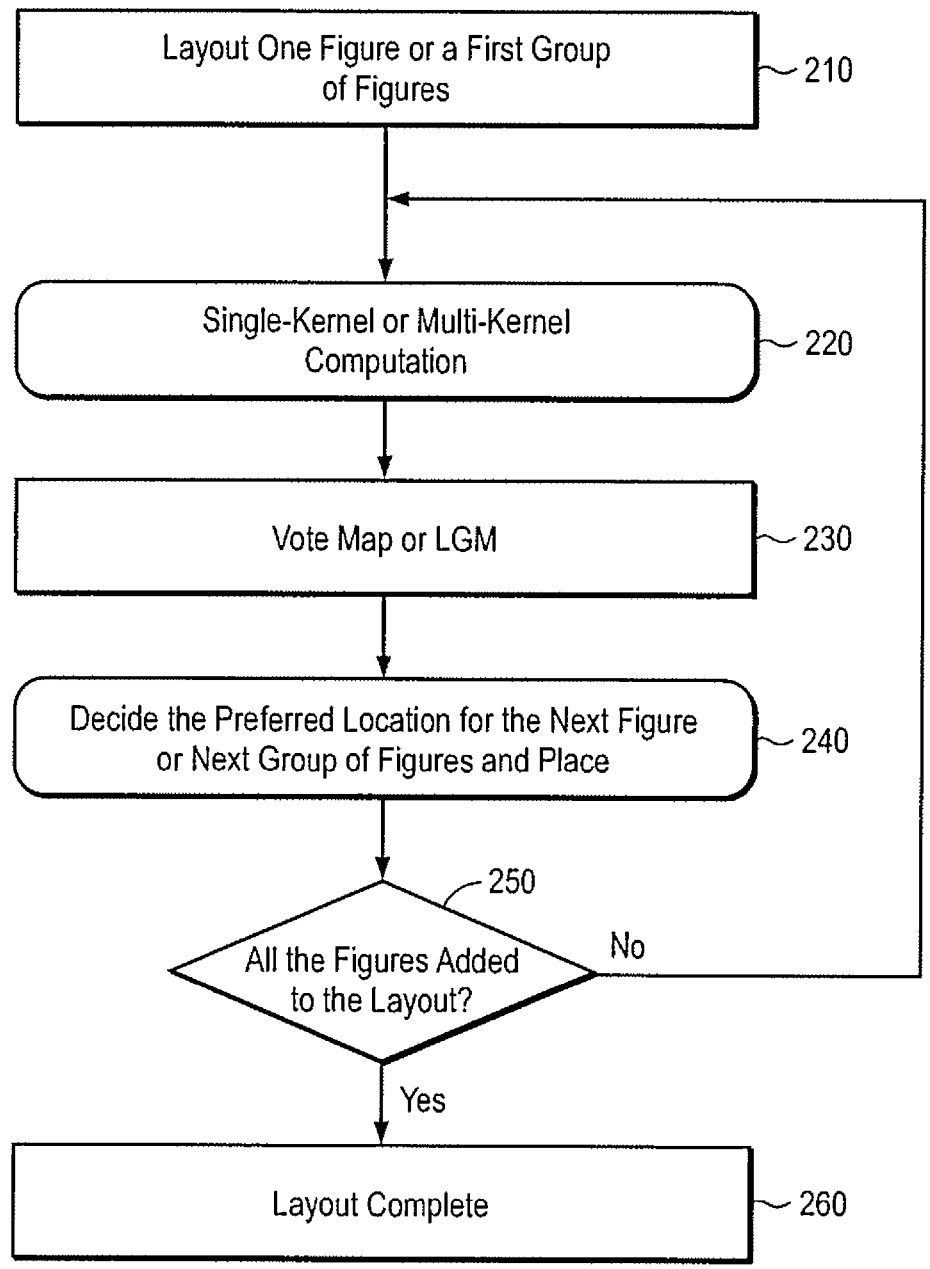
FIG. 2 is an flowchart illustrating an example of the steps for performing the lithography guided layout process according to one embodiment of the invention.

FIG. 2 is an exemplary flowchart illustrating an exemplary process of the LGL process of the present invention. In the first step of the process (Step 210), utilizing the target design, one or more of the features included in the target design are placed in a mask pattern in accordance with their corresponding positions in the target pattern. It is noted that the number of features from the target pattern to be added to the mask pattern each iteration can be determined, for example, by the operator, or may be defined as some fixed number, or may be governed by the process being utilized and the number of features deemed critical in the target design. In another variation, it is possible to add only a single feature per iteration.

At step 220, a simulation of the illumination of the current mask pattern for a given lithography process (i.e., the process to be utilized to illuminate the target pattern) is performed so as to produce an aerial image (or equivalent thereof) which indicates the imaging performance of the current mask pattern including an indication of whether or not the areas adjacent and surrounding the features on the current mask contribute positively or negatively to the imaging of the features on the current mask. As noted above, any suitable model which provides the foregoing information may be utilized. In the given embodiment, the model utilized is the one for generating the SGM noted above. Referring to FIG. 2, in Steps 220 and 230, the aerial image corresponding to the current mask is simulated utilizing, for example, either a single-kernel or multi-kernel computation, and then the SGM is determined, for example, in the manner detailed below. As noted, the SGM provides on a pixel-by-pixel basis an indication of whether or not the given pixel would contribute positively to the through-focus and through-dose edge behavior of existing mask patterns if an addition feature was positioned at the location of the given pixel. In other words, if the SGM value is positive, then a hypothetical unit source placed there would improve the overall through-focus and through-dose edge behavior of existing patterns; the larger the SGM value, the greater improvement. If the SGM value is negative, then a hypothetical unit source placed there would negatively impact or degrade the overall through-focus and through-dose edge behavior of existing patterns.

Once the SGM is generated, it corresponds to the "vote map" or layout guidance map (LGM), and represents the integration of all the edge points for the current features on the mask for each pixel in the field area of the current mask (i.e., areas not already having features disposed thereon), and provides an indication of whether or not each pixel in the field area is suitable for having a feature disposed thereon (i.e., the pixel contributes positively to the imaging of the current mask features) or should be avoided if possible (i.e., the pixel contributes negatively to the imaging of the current mask features).

In the next step of the process (Step 240), the LGM or vote map is utilized to determine the preferred location of the next feature or set of features to be placed in the mask design. As one possible example (alternative methods are disclosed below), this can be accomplished, for example, by integrating the value of the pixels within the area of the LGM in which the next feature has been originally designated for, and then if the value of the summation of the pixels in this area is above some predefined threshold (which indicates the feature can be properly imaged), the feature is added to the mask design in the designated space/location. However, if the value of the summation of the pixels is below the predefined threshold, the LGM is then utilized to determine if it is possible to reposition the feature within the mask design such that the summation of the pixels in the area corresponding to the adjusted location of the feature is above the predefined threshold. By shifting the location of feature in one or more directions within the mask design, it is possible to increase the value of the summation of the pixels, and thereby optimize the affect the feature to be added has on the existing features.

Once the features currently under consideration are placed within the mask design, the process proceeds to Step 250, which determines if all features in the target pattern or design have been processed. If the answer is YES, the process proceeds to Step 260 and the layout is complete. If the answer is NO, the process proceeds back to Step 220 and re-computes a new SGM which includes all of the features currently placed in the mask design, including those added during the previous iteration, and then re-performs Steps 220-250 until all features in the target pattern have been processed.

Figure 11:
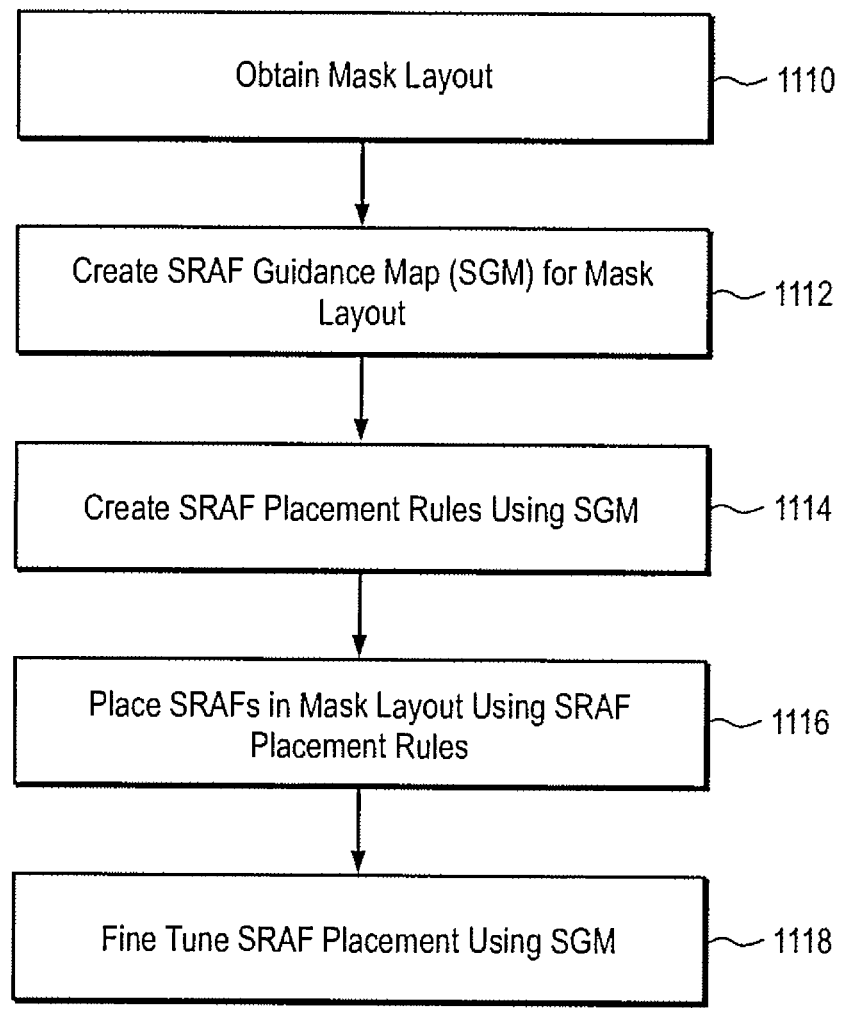
FIG. 11 is a flowchart of a method for generating model-based subresolution features according to one embodiment of the invention.

FIG. 11 is a flowchart that depicts one method for generating model-based sub-resolution assist features, according to one embodiment of the invention. In step 1110, a mask layout is obtained. The mask layout is typically the pre-OPC (design) layout. In step 1112, an SRAF guidance map (SGM) is created for the mask layout. The SGM is an image in which each pixel value is an indication of whether the pixel would contribute positively to through-focus and through-dose edge behavior of features in the mask layout if the pixel is included as part of an SRAF. If the SGM value for a pixel is positive, then a unit source (i.e., a single pixel SRAF) at that pixel location would improve the overall through-focus and through-dose edge behavior, and the larger the SGM value, the greater the improvement. Creating the SGM is further described below in conjunction with FIGS. 4 and 5. In step 1114, SRAF placement rules for the mask layout are created using the SGM. Creation of SRAF placement rules based on the SGM is further described below in conjunction with FIGS. 6A, 6B, and 6C. In step 1116, SRAFs are placed in the post-OPC layout using the SRAF placement rules. In optional step 1118, the placed SRAFs are fine tuned using the SGM. For example, the SGM may indicate that a placed SRAF should be slightly wider than the width dictated by the rule.

Figure 3:
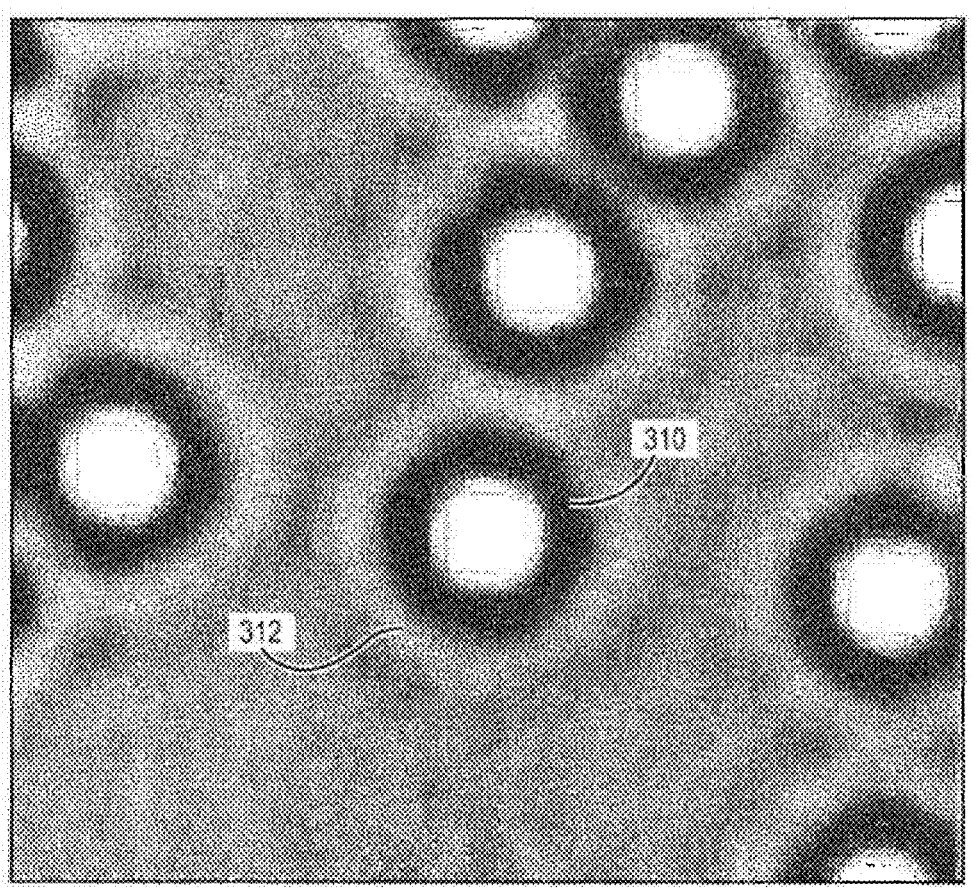
FIG. 3 is an exemplary embodiment of an SRAF guidance map (SGM) for a design layout of a contact layer.

FIG. 3 shows an example of an SGM of a contact layer, where the squares depict the contacts 310. If mask rule check and SRAF printability issues are not considered, in the given exemplary SGM, pixels in the bright regions not within or immediately adjacent to the features, such as region 312, have positive SGM values and therefore would be suitable for placement of new patterns. Pixels in dark regions, which are pixels having a negative SGM value, should be avoided with respect to the placement of new patterns if possible. It is noted that an SGM can be generated for a mask layout of any mask layer including both dark field and clear masks.

It is noted that through-focus and through-dose edge behavior can be described using the edge slope of the aerial image at the design target edge locations. A higher edge slope improves the process window robustness of the feature, both for changes in dose and for defocus. Dose change is essentially a threshold change and defocus can be well approximated by a low-pass blurring effect. High edge slope improves the robustness against variations in both dose and defocus, which improves the overall process window. So the goal of improving process window robustness is transformed into the goal of increasing the edge slope at the design target edge locations.

Figure 4:
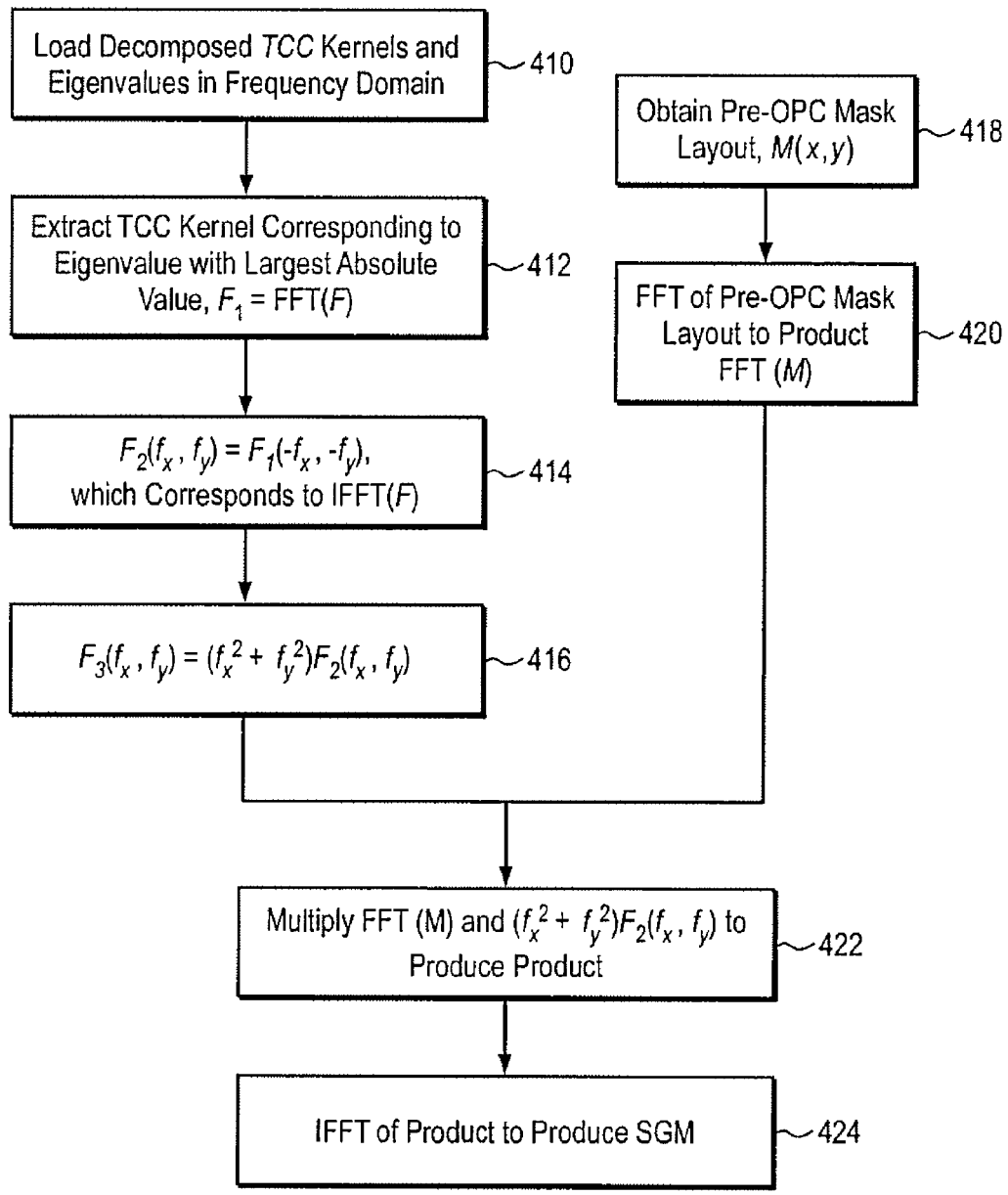
FIG. 4 is an exemplary flowchart illustrating a first method for generating an SRAF guidance map (SGM)

FIG. 4 is an exemplary flowchart of a first method for generating an SRAF guidance map (SGM). The method of FIG. 4 is a single-kernel approach in which it is assumed that the optical path of the exposure tool is "near" coherent and only the first term of the TCC for the exposure tool is considered.

The partial coherent aerial image intensity can be formulated as the following:

$$I = L_0 * (M \otimes F_0)^2 + L_1 * (M \otimes F_1)^2 + \ldots + L_n * (M \otimes F_n)^2$$

Where: M is the mask image; n is the number of eigenvalues of the Transmission Cross Coefficients (TCCs); $F_0$ to $F_n$ are the real-space filters corresponding to each TCC term; $L_0$ to $L_n$ are the corresponding eigenvalues of each TCC term; "$\otimes$" means convolution, and "*" is the regular multiplication.

In the single kernel approach of FIG. 4, the emphasis is on the aerial image amplitude from the kernel corresponding to the eigenvalues with the largest absolute value, then:

$$A = \sqrt{I} \approx M \otimes F$$

where $F = F(x,y)$ is a scalar field. This field's gradient vector is denoted as $\overline{D}$: $\overline{D} = (x,y) = (D_x, D_y)$ where $(D_x, D_y)$ is a vector field with two components:

$$D_x = \frac{\partial F}{\partial x} \quad D_y = \frac{\partial F}{\partial y}$$

For an edge, its edge vector $\overline{E}$ is defined as the following: its direction is perpendicular to the edge, and points to the direction with positive edge slope in aerial image A.

Now, from one edge location, the edge's environment is considered as a field. Assuming that the unit source is at the field location (x,y), then the aerial image amplitude for an arbitrary point $(x_1, y_1)$ is $F(x_1-x, y_1-y)$. This unit source's contribution to the slope of the edge point, which is located at (x',y'), is proportional to:

$$S(x,y,x',y') = \overline{D}(x'-x, y'-y) * \overline{E}(x',y')$$

where "*" denotes an inner vector multiplication, so the result is a scalar S(x,y,x',y').

So, for each edge point, every field location's contribution to its slope can be calculated. Unit sources at some field locations will give positive contribution, some negative. This contribution can then be regarded as the "vote" by this edge point on whether that field point in the mask layout should be placed with a unit source.

Now, for each field point, the "votes" from all edge points are integrated to produce an integrated final vote for this field point. This final vote is on whether this field point should be placed with a unit source. Hence, a threshold is applied to this vote field to decide where to place the next pattern.

One problem arises if such a filtering operation is used is that it is applied per edge point. Since the edge point could be very irregular, this operation may be quite computationally expensive. Other disadvantages of this brute-force vote count scheme are: (1) edges are sampled, so the effects from a continuous edge are not considered; (2) corners' edge location is from the pre-OPC layout's sharp corners, which is actually not the desired contour target location. The true target contour of a corner is actually a round corner, and the slope on that round contour should be enhanced.

To address this problem, the above-described vote-counting operation is transformed into a classical image processing algorithm, enabling the vote count using three Fast Fourier Transform (FFT) operations. By formulating the vote counting process using FFT operations, the computation speed is vastly improved, with or without hardware accelerations, such as use of the full-chip lithography simulation system disclosed in U.S. Pat. No. 7,003,758. Furthermore, using FFT computations automatically overcomes the two disadvantages mentioned above. All edges are continuously considered, and corners are rounded (the rounding amount depends on the pixel size).

In step 418, a pre-OPC mask layout M(x,y) is obtained. The gradient map $\overline{G}(x,y)=(G_x, G_y)$ of the pre-OPC mask layout is a vector map composed of:

$$G_x = \frac{\partial M(x, y)}{\partial x} \quad G_y = \frac{\partial M(x, y)}{\partial y}$$

Now, the exact edge points are all the points that have gradients. The vote on a particular field point comes from every point in the mask image with a non-zero gradient, based on whether a unit source on that field point will enhance the gradient. For a unit source at field point (x,y), its contribution to a gradient value at (x',y') is:

$$v(x, y, x', y') = \overline{D}(x' - x, y' - y) * \overline{G}(x', y')$$
$$= G_x(x', y')D_x(x' - x, y' - y) -$$
$$G_y(x', y')D_y(x' - x, y' - y)$$

Again, "*" represents an inner vector multiplication. The "v" value can be treated as the vote from the gradient at (x,y) to the field point (x',y'), so the total vote sum from the unit source at field point (x,y) is $$V(x, y) = \sum_{(x',y')} v(x, y, x', y')$$
$$= \sum_{(x',y')} [G_x(x', y')D_x(x' - x, y' - y) + G_y(x', y')D_y(x' - x, y' - y)]$$

$G_x$ and $G_y$ are the two gradient component images of M(x, y), and $D_x$ and $D_y$ are prior known filters. The SUM operation is now a standard convolution filtering on a regular image grid. So V can be computed by two filtering operations. These two filtering operations are quite expensive if performed in real-space, since $D_x$ and $D_y$ are non-separable large filters. So, to make these two filtering operations manageable, they are performed in the frequency domain.

In the frequency domain, there is no need to compute $G_x$ and $G_y$ explicitly. Instead, $G_x$ and $G_y$ can be computed directly from M(x,y).

If Z(x) is an arbitrary function, FFT(Z(x)) is its Fourier Transform, and F'(x)=dZ/dx is its derivative, then the Fourier Transform of Z'(x) is FFT(Z'(x))=if FFT(Z(x))

Where i is the imaginary unit, f is the frequency. As a result,

FFT($G_x$)=i$f_x$FFT(M), FFT($G_y$)=i$f_y$FFT(M)

FFT($D_x$)=i$f_x$FFT(F), FFT($D_y$)=i$f_y$FFT(F)

So the total vote sum, the SGM value, at field point (x,y), is $$V(x, y) = \sum_{(x',y')} [G_x(x', y')D_x(x' - x, y' - y) + G_y(x', y')D_y(x' - x', y' - y)]$$
$$= G_x(x, y) \otimes D_x(-x, -y) - G_y(x, y) \otimes D_y(-x, -y)$$
$$= -IFFT(FFT(G_x) * IFFT(D_x) + FFT(G_y) * IFFT(D_y))$$
$$= IFFT((f_x^2 + f_y^2)FFT(M) * IFFT(F))$$

Where IFFT( ) represents the inverse Fast Fourier Transform, "⊗" means convolution, and "*" is the regular multiplication. Since $F_3(f_x,f_y)=(f_x^2+f_y^2)$IFFT(F) can be pre-computed because the optical model is the same for any mask, the real-time computation of the SGM value at each field point only involves two FFT computations: FFT(M) and one IFFT. In step 420, an FFT is applied to the pre-OPC mask layout to produce FFT(M). A TCC is typically decomposed into convolution kernels, using an eigen-series expansion for computation speed and storage. Therefore, in step 410, a decomposed version of TCC is loaded, and then in steps 412 and 414, FFT(F) is converted to IFFT(F). In step 416, $F_3(f_x,f_y)=(f_x^2+f_y^2)$IFFT(F) is computed. Then, in step 420, $F_3(f_x,f_y)$ is multiplied by FFT(M) and in step 422, the IFFT is taken of the product to produce the SGM for the entire pre-OPC design layout.

Figure 5:
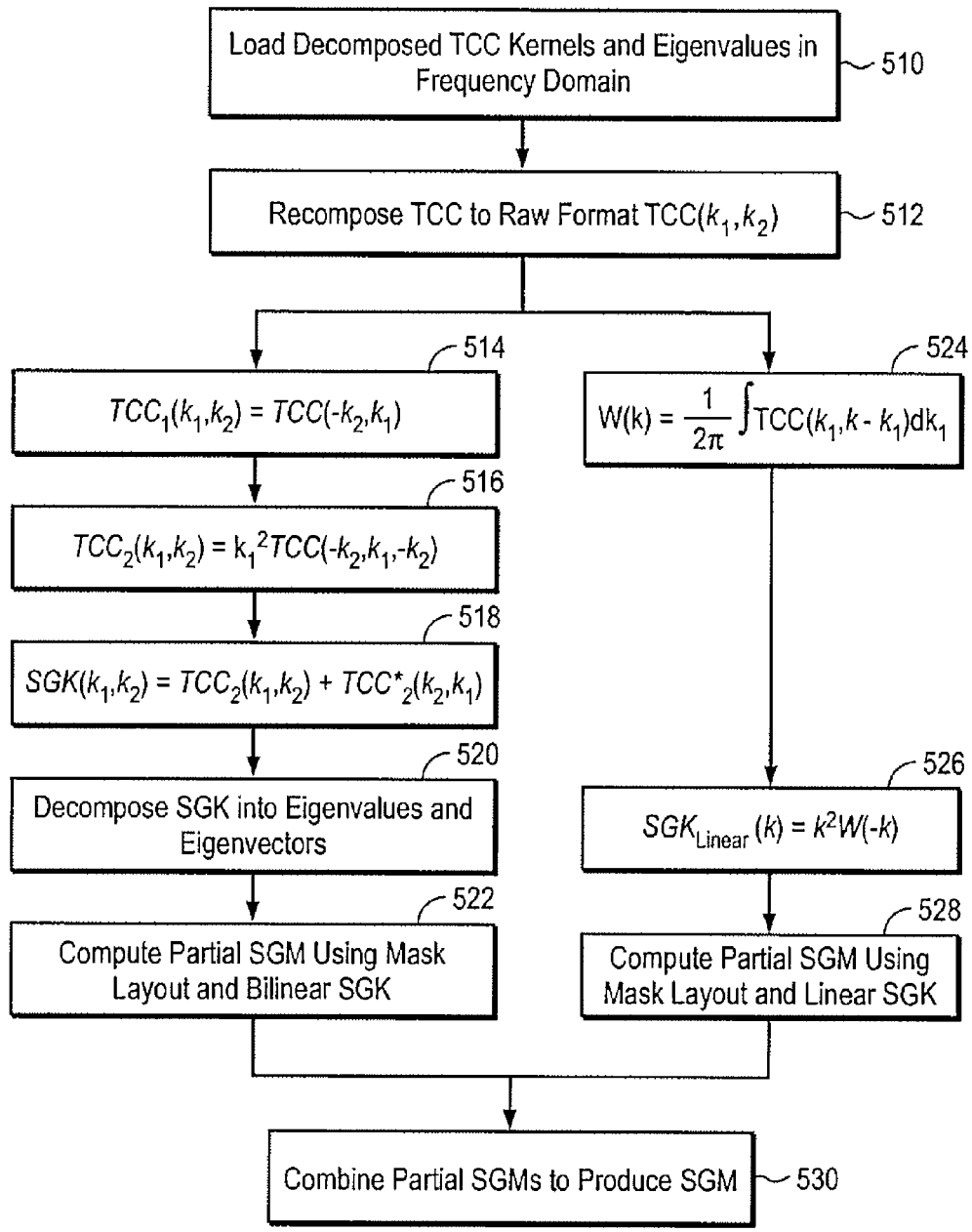
FIG. 5 is an exemplary flowchart illustrating a second method step for generating an SRAF guidance map (SGM).

FIG. 5 is an exemplary flowchart of a second method for generating an SRAF guidance map (SGM). The FIG. 5 embodiment is a multi-kernel approach in which the optical path of the exposure tool is not assumed to be near coherent. For ease of discussion, the following equations are written as if there is only one spatial dimension.

Mask transmittance M(x) is separated into a pre-OPC component (T), an SRAF component (A) and an OPC corrections component (C):

$$M(x)=M^T(x)+M^A(x)+M^C(x)$$

If $$M^K(x)=M^T(x)+M^C(x)$$

represents the post-OPC layout transmittance, then the aerial image (AI) intensity is $$I(x) = \int [M^K(x_1) + M^A(x_1)][M^{K^*}(x_2) + M^{A^*}(x_2)]$$
$$W(x - x_1, x - x_2)dx_1 dx_2$$
$$= \int \begin{bmatrix} M^K(x_1)M^{K^*}(x_2) + M^A(x_1)M^{K^*}(x_2) + \\ M^K(x_1)M^{A^*}(x_2) + M^A(x_1)M^{A^*}(x_2) \end{bmatrix}$$
$$W(x - x_1, x - x_2)dx_1 dx_2$$
$$= I^T(x) + \begin{bmatrix} M^A(x_1)M^{K^*}(x_2) + \\ M^K(x_1)M^{A^*}(x_2) + M^A(x_1)M^{A^*}(x_2) \end{bmatrix}$$
$$W(x - x_1, x - x_2)dx_1 dx_2$$

where W(x,y) is the space domain representation of TCC and $I^T(x)$ is the AI intensity without SRAF.

To derive the SGM expression, a unit source at x' in the SRAF portion of the mask layout is assumed, i.e., $M^A(x)=\delta(x-x')$. This unit source at x' contributes the following amount to the image slope at x:

$$\frac{dI(x)}{dx} - \frac{dI^T(x)}{dx} = \frac{d}{dx}\int [M^A(x_1)M^{K*}(x_2) + M^K(x_1)M^{A*}(x_2) +$$
$$M^A(x_1)M^{A*}(x_2)]W(x-x_1, x-x_2)dx_1 dx_2$$
$$= \frac{d}{dx}\int [\delta(x_1-x')M^{K*}(x_2) + M^K(x_1)\delta(x-x_2) +$$
$$\delta(x-x_1)\delta(x-x_2)]W(x-x_1, x-x_2)dx_1 dx_2$$
$$= \frac{d}{dx}\int [W(x-x', x-x_1)M^{K*}(x_1) + M^K(x_1)W(x-x_1, x-x')]dx_1 dx_2 + \frac{d}{dx}W(x-x', x-x')$$

The weighting of the vote from field point x to source point x' is equal to the gradient of the pre-OPC image, $$\frac{dM^R(x)}{dx} = \frac{1}{2}\frac{d}{dx}[M^T(x) + M^{T*}(x)]$$

So the SGM value at x' is equal to $$V(x') = \int \frac{dM^R(x)}{dx}\frac{d(I(x)-I^T(x))}{dx}dx$$
$$= \int \frac{dM^R(x)}{dx}\frac{d}{dx}\left\{\int [W(x-x', x-x_1)M^{K*}(x_1) + M^K(x_1)W(x-x_1, x-x')]dx_1\right\}dx +$$
$$\int \frac{dM^R(x)}{dx}\frac{d}{dx}W(x-x', x-x')dx$$
$$= -\int M^R(x)\frac{d^2}{dx^2}\left\{\int [W(x-x', x-x_1)M^{K*}(x_1) + M^K(x_1)W(x-x_1, x-x')]dx_1\right\}dx -$$
$$\int M^R(x)\frac{d^2}{dx^2}W(x-x', x-x')dx$$

The last step in the above makes use of integration by parts. This expression does not reduce to the single-kernel SGM expression above even in the limit of coherent illumination because the single-kernel SGM essentially looks at the contribution to the gradient of the amplitude instead of the intensity.

Finally, with a change in variable names:

$$V(x) = \int \left[M^R(x_1)M^K(x_2)\frac{d^2}{dx_1^2}W(x_1-x_2, x_1-x) + M^R(x_1)M^{K*}(x_2)\frac{d^2}{dx_1^2}W(x_1-x, x_1-x_2)\right]dx_1 dx_2 -$$
$$\int M^R(x_1)\frac{d^2}{dx_1^2}W(x_1-x, x_1-x)dx_1$$
$$= -\int \left[M^R(x-x_1)M^K(x-x_2)\frac{d^2}{dx_1^2}W(x_2-x_1, -x_1) + M^R(x-x_1)M^{K*}(x-x_2)\frac{d^2}{dx_1^2}W(-x_1, x_2-x_1)\right]dx_1 dx_2 -$$
$$\int M^R(x-x_1)\frac{d^2}{dx_1^2}W(-x_1, -x_1)dx_1$$

The Hermiticity of the SGM bilinear kernel is observed if $x_1$ is replaced by $x_2$ in the second term.

When $M^T$ is real and the OPC correction component ($M^C$) is ignored, then $M^R = M^K = M^{K*} = M^T = M^{T*}$ and the above formula resembles the Hopkins equation, which means the SGM may be computed using the standard kernel decomposition technique.

If $M^K$ is real and the OPC correction component ($M^C$) is not ignored, this is a bilinear integration involving two different input images (pre-OPC mask layout $M^R = M^T$ and post-OPC mask layout without SRAF $M^K = M^{K*} = M^T + M^C$).

The SGM bilinear kernel (SGK) can be related to the TCC in the frequency domain. When $M^T$ is real and the OPC correction component ($M^C$) is ignored, $$SGK(k_1, k_2) = -\mathcal{F}\left[\frac{d^2}{d\xi_1^2}W(\xi_2-\xi_1, -\xi_1) + \frac{d^2}{d\xi_2^2}W(-\xi_2, \xi_2-\xi_1)\right]$$
$$= -\int \left[\frac{d^2}{d\xi_1^2}W(\xi_2-\xi_1, -\xi_1) + \frac{d^2}{d\xi_2^2}W(-\xi_2, \xi_2-\xi_1)\right]\exp(-ik_1\xi_1 + ik_2\xi_2)d\xi_1, d\xi_2$$
$$= k_1^2 \int W(\xi_2-\xi_1, -\xi_1)\exp(-ik_1\xi_1 + ik_2\xi_2)d\xi_1 d\xi_2 +$$
$$k_2^2 \int W(-\xi_2, \xi_2-\xi_1)\exp(-ik_1\xi_1 + ik_2\xi_2)d\xi_1 d\xi_2$$
$$= k_1^2 \int W(\xi_1', \xi_2')\exp(ik_1\xi_2' + ik_2(\xi_1' - \xi_2'))d\xi_1' d\xi_2' +$$
$$k_2^2 \int W(\xi_1', \xi_2')\exp(-ik_1(\xi_2' - \xi_1') - ik_2\xi_1')d\xi_1' d\xi_2'$$
$$= k_1^2 TCC(-k_2, k_1-k_2) + k_2^2 TCC(-k_1+k_2, -k_1)$$

The Hermiticity of the above is readily confirmed.

A practical difficulty is that if this formula is used directly, two raw TCCs appear simultaneously, which may be not feasible if the TCC is large (e.g., if each dimension of the TCC is 107 with float data type, then the total memory requirement exceeds 2G bytes). Therefore, it is desirable to make the computation "in-place." To do so, the SGM bilinear kernel can be decomposed as $TCC_1(k_1,k_2)=TCC(-k_2,k_1)$ $TCC_2(k_1,k_2)=k_1^2 TCC_1(k_1-k_2,k_2)=k_1^2 TCC(-k_2,k_1-k_2)$ $SGK(k_1,k_2)=TCC_2(k_1,k_2)+TCC_2*(k_2,k_1)$ where each step is in-place.

Another practical consideration is that TCC is typically decomposed into convolution kernels, using an eigen-series expansion for computation speed and storage. Therefore, in step 510, a decomposed version of TCC is loaded, and then in step 512 the decomposed version of TCC is re-composed into a raw format. In steps 514-518, the SGM bilinear kernel (SGK(($k_1, k_2$)) is computed in-place, and then in step 520 the SGM bilinear kernel is decomposed into eigenvalues and eigenvectors. In step 522, a partial SGM is computed using the mask layout, the decomposed SGM bilinear kernel, and existing fast bilinear operations. In the method of FIG. 5 it is assumed that $M^R = M^{K*} = M^{K*} = M^T = M^{T*}$.

In steps 524 and 526, the SGM linear kernel is calculated. The spectrum of the SGM linear term kernel is expressed as:

$$SGK_{Linear}(k) = -\mathcal{F}\left[\frac{d^2}{d\xi^2}W(-\xi, -\xi)\right]$$

$$= -\int \left[\frac{d^2}{d\xi^2}W(-\xi, -\xi)\right]\exp(-ik\xi)d\xi$$

$$= k^2 \int W(-\xi, -\xi)\exp(-ik\xi)d\xi$$

$$= k^2 \mathcal{W}(-k)$$

where $W(K)$ is the Fourier transform of $W(\xi,\xi)$.

$W(\xi_1,\xi_2)$ is also the inverse Fourier transform of $TCC(k_1, k_2)$. Thus, $$\mathcal{W}(k) = \frac{1}{2\pi}\int TCC(k_1, k-k_1)dk_1$$

This expression is for the continuous function analysis. However, when a DFT (Discrete Fourier Transform) is used in practice, the constant $2\pi$ should be replaced by the sequence length of the DFT. In step 528, another partial SGM is calculated by convolving the mask layout with the SGM linear kernel. In step 530, the partial SGMs are combined to produce the SGM. Note that steps 410-416 in FIG. 4 and steps 510-520 in FIG. 5 can be pre-executed for each optical model to improve run-time speed.

For a new feature to optimize the process window, its placement should be optimized when the edge slope is the weakest. In general, edge slopes are lower at defocus, so the TCC at defocus and/or delta dose should be used to compute the SGM, so that the edge slope is maximized at those weakest PW points.

Different weights can be assigned to different target edge locations in the SGM computation, since different edge points may have different importance. For example, a higher weight can be assigned to the votes by poly-gate edge points, and a lower weight assigned to votes from large patterns and line ends. This weighting approach enables differential treatment for patterns of different importance for process window behavior. An additional consideration in assigning a weight to edge points is the edge's existing slope, such that a higher weight is given to those edge locations that have low edge slope since they are hot spots (i.e., weak points in the layout over process window variation). For this, OPC corrections without SRAFs can be applied to a mask layout, the aerial image computed, and then the aerial image's edge slope at each edge location computed. The inverse of ILS (image log slope) for an edge location can be used as that edge location's weight. These two weighting approaches, i.e., a feature importance-based weight and an ILS-based weight, can also be combined to give a combined weight. Other possible weighting schemes are within the scope of the invention.

To apply weighting in the SGM computation, the relative importance of each edge evaluation point is identified based on, e.g., gate vs. non-gate, line vs. corner, line width, etc. A non-negative weight is then assigned to each edge evaluation point. For example, a weight of 1 is nominal, any value above 1 is additional weight (so, weight 2.0 means the edge point's vote is twice important as nominal-weighted points), any value below 1 is lower weight (i.e., weight 0 means the edge point's vote should not be counted at all and weight 0.5 means the edge point's vote is counted as 50% of nominal-weighted points), and a weight never goes below 0.0. Next, a weight image $Wm(x,y)$ is rendered at the same pixel grid of the pre-OPC layout $M(x,y)$, assuming each weight is a delta function at the edge point location $(x,y)$, and a low-pass filter is applied to the weight image to match the pass-band of the pre-OPC layout's sampling frequency. The final weight map image is multiplied with the gradient of the pre-OPC layout $M(x,y)$ and the result is used as the weighted target image in computing the SGM.

For the single-kernel SGM, the vote map is changed to $$V(x,y) = \sum_{(x',y')}[Wm(x',y')G_x(x',y')D_x(x'-x, y'-y) +$$

$$Wm(x',y')G_y(x',y')D_y(x'-x, y'-y)]$$

$$= [Wm(x,y)G_x(x,y)] \otimes D_x(-x, -y) -$$

$$[Wm(x,y)G_y(x,y)] \otimes D_y(-x, -y)$$

$$= -IFFT(FFT(WmG_x) * IFFT(D_x) + FFT(WmG_y) * IFFT(D_y))$$

$$= -iIFFT((f_x FFT(WmG_x) + f_y FFT(WmG_y)) * IFFT(F))$$

For the multi-kernel SGM, the vote map is changed to $$V(x') = \int Wm(x)\frac{dM^R(x)}{dx}\frac{d(I(x)-I^T(x))}{dx}dx$$

$$= \int Wm(x)\frac{dM^R(x)}{dx}\frac{d}{dx}$$

$$\left\{\int [W(x-x', x-x_1)M^{K*}(x_1) +\right.$$

$$\left. M^K(x_1)W(x-x_1, x-x')]dx_1\right\}dx +$$

$$\int Wm(x)\frac{dM^R(x)}{dx}\frac{d}{dx}W(x-x', x-x')dx$$

$$= -\int Wm(x)M^R(x)\frac{d^2}{dx^2}$$

$$\left\{\int [W(x-x', x-x_1)M^{K*}(x_1) +\right.$$

$$\left. M^K(x_1)W(x-x_1, x-x')]dx_1\right\}dx -$$

$$\int Wm(x)M^R(x)\frac{d^2}{dx^2}W(x-x', x-x')dx -$$

$$\int Wm'(x)M^R(x)\frac{d}{dx}$$

$$\left\{\int [W(x-x', x-x_1)M^{K*}(x_1) +\right.$$

$$\left. M^K(x_1)W(x-x_1, x-x')]dx_1\right\}dx -$$

$$\int Wm'(x)M^R(x)\frac{d}{dx}W(x-x', x-x')dx$$

Again, with a change in variables, $$V(x) = -\int\int \left[Wm(x_1)M^R(x_1)M^K(x_2)\frac{d^2}{dx_1^2}W(x_1-x_2, x_1-x) +\right.$$

$$\left. Wm(x_1)M^R(x_1)M^{K*}(x_2)\frac{d^2}{dx_1^2}W(x_1-x, x_1-x_2)\right]dx_1 dx_2 -$$

$$\int Wm'(x_1)M^R(x_1)\frac{d^2}{dx_1^2}W(x_1-x, x_1-x)dx_1 -$$

$$\int\int \left[Wm'(x_1)M^R(x_1)M^K(x_2)\frac{d}{dx_1}W(x_1-x_2, x_1-x) +\right.$$

-continued $$Wm'(x_1)M^R(x_1)M^{K^*}(x_2)\frac{d}{dx_1}W(x_1-x,x_1-x_2)\Big]dx_1dx_2 -$$

$$\int Wm'(x_1)M^R(x_1)\frac{d}{dx_1}W(x_1-x,x_1-x)dx_1$$

$$= -\int\Big[Wm(x-x_1)M^R(x-x_1)M^K(x-x_2)\frac{d^2}{dx_1^2}W(x_2-x_1,x_1) +$$

$$Wm(x-x_1)M^R(x-x_1)M^{K^*}(x-x_2)\frac{d^2}{dx_1^2}W(-x_1,x_2-x_1)\Big]dx_1dx_2 -$$

$$\int Wm(x-x_1)M^R(x-x_1)\frac{d^2}{dx_1^2}W(-x_1,-x_1)dx_1 +$$

$$\int\Big[Wm'(x-x_1)M^R(x-x_1)M^K(x-x_2)\frac{d}{dx_1}W(x_2-x_1,-x_1) +$$

$$Wm'(x-x_1)M^R(x-x_1)M^{K^*}(x-x_2)\frac{d}{dx_1}W(-x_1,x_2-x_1)\Big]dx_1dx_2 +$$

$$\int Wm'(x-x_1)M^R(x-x_1)\frac{d}{dx_1}W(-x_1,x_1)dx_1$$

The first three integrations resemble the unweighted SGM with the same kernels. The only difference is that the mask image $M^R$ is replaced by $WmM^R$. When $M^T$ is real and the OPC correction ($M^C$) is ignored, the kernel for the fourth and fifth integrations is $$SGK^W(k_1,k_2) = \mathcal{F}\Big[\frac{d}{d\xi_1}W(\xi_2-\xi_1,-\xi_1) + \frac{d^2}{d\xi_2}W(-\xi_2,\xi_1-\xi_2)\Big]$$

$$= \int\Big[\frac{d}{d\xi_1}W(\xi_2-\xi_1,-\xi_1) + \frac{d}{d\xi_2}W(-\xi_2,\xi_1-\xi_2)\Big]$$

$$\exp(-ik_1\xi_1+ik_2\xi_2)d\xi_1d\xi_2$$

$$= ik_1\int W(\xi_2-\xi_1,-\xi_1)\exp(-ik_1\xi_1+ik_2\xi_2)d\xi_1d\xi_2 -$$

$$ik_2\int W(-\xi_2,\xi_1-\xi_2)\exp(-ik_1\xi_1+ik_2\xi_2)d\xi_1d\xi_2$$

$$= ik_1\int W(\xi_1',\xi_2')\exp(ik_1\xi_2'+ik_2(\xi_1'-\xi_2'))d\xi_1'd\xi_2' -$$

$$ik_2\int W(\xi_1',\xi_2')\exp(-ik_1(\xi_2'-\xi_1')-ik_2\xi_1')d\xi_1'd\xi_2'$$

$$= ik_1 TCC(-k_2,k_1-k_2) - ik_2 TCC(-k_1+k_2,-k_1)$$

The kernel for the last integration becomes $$SGK^W_{Linear}(k) = \mathcal{F}\Big[\frac{d^2}{d\xi^2}W(-\xi,-\xi)\Big]$$

$$= \int\Big[\frac{d^2}{d\xi^2}W(-\xi,-\xi)\Big]\exp(-ik\xi)d\xi$$

$$= -ik\int W(-\xi,-\xi)\exp(-ik\xi)d\xi$$

$$= -ik'W(-k)$$

where $W(K)$ is defined previously.

As discussed above, the SGM (also referred to as LGM herein) can be utilized as a basis for guidance of subsequent patterns to enhance the PW behavior of existing patterns on the layout.

In particular, it is possible to guide the chip design in a sequential way. In each sequential step, a group of new patterns is added into the layout, as chosen by the routing software. The LGM is then computed for all the existing patterns in the layout, the new LGM is then utilized to guide the addition of subsequent features to the layout. In one embodiment, a threshold T is applied to the LGM so that all pixels with LGM values below the threshold are marked as forbidden or undesirable locations for next line or pattern. These forbidden or undesirable locations and Design Rule Checking (DRC) together dictate usable and unusable areas for the next line or pattern. For the usable areas, the bright areas in LGM (i.e., areas with clustered pixels of large LGM values) correspond to areas suitable to accommodate the next line or feature. It is also possible to define an object function, which includes the total LGM covered by the next line or figure, the length of line, and so on, and then maximize (or minimize, depending on the actual definition of the objection function) the object function to solve the optimal locations for the next line or feature to be placed in the mask layout.

For example, if it is desirable to optimize the line placement between points A and B over line width w and path $\mathcal{L}$ (A,B), an exemplary cost function can be written as:

$$f(w,\mathcal{L}(A,B)) = \alpha L(\mathcal{L}(A,B)) + \beta \text{SUM\_LGM}(w,\mathcal{L}(A,B))$$

where L($\mathcal{L}$ (A,B)) represents the path length of $\mathcal{L}$ (A,B), SUM_LGM(w, $\mathcal{L}$ (A,B)) represents the total LGM value covered by this line $\mathcal{L}$ (A,B) with width w, α and β are user-specified Lagrange multipliers (weights) for the trade-off between line length and LGM optimization, and they should have different signs. It is assumed that α<0 and β>0. As a result, this line placement problem becomes the optimization problem:

$$\max f(w,\mathcal{L}(A,B))$$

subject to the constraints that no point in this path has an LGM value below the threshold T or violates any DRC rules. These constraints can also be added to the object function with a very large negative weight on those points with big adversary impact on PW performance of existing patterns or violating DRC rules.

Alternatively, the LGM may also be used as a (inverse) weight on the route length in line layout, then the problem can be converted to an optimal (weighted) route search problem. Examples of route search algorithms include, but are not limited to, breadth-first search, Dijkstra algorithm, Viterbi algorithm, and Floyd-Warshall algorithm.

Then, as noted above, this process and including the LGM is continuously updated with new patterns until all the lines or features are added to the layout.

Each step of this sequential placement strengthens the overall contrast of already placed patterns/features by employing the LGM as guidance for subsequent pattern placement. Thus, in the resulting layout, patterns are mutually constructive and the overall PW performance can be greatly improved with little extra cost, which is the ultimate goal of DFM methodology. This methodology also has the advantages of low computational cost and taking two-dimensional geometry into consideration.

The LGM can be easily used for multiple layers which need to be considered together simultaneously during layout, for example, poly and diffusion, or metal and contact. For each individual circuit layer, the LGM is computed separately for the layer itself, because lithographical patterning occurs in different time for the different layers. The circuit-level association and dependency between the different layers are to be maintained by the layout software.

Further, the LGM can be utilized to provide guidance to either automated place-and-route software, or to a human user performing manual layout, e.g., of standard cells. In addition to providing suggestions on where the next patterns should be placed, the method can also provide a score based on LGM indicating the level of robustness of the design for lithography.

In addition, the LGL method disclosed herein can be used in combination with OPC and OPC verification software, to validate the robustness of the design.

Further, the application of LGL can be used in either the placement or the routing stage of IC circuit layout, or both. Specifically, the LGL method can be applied to provide guidance to the placement of pre-defined standard cells, to enhance lithographic performance. In this application, the entire pre-defined standard cell is treated as a single fixed figure, and the LGM will give the score of the placement by summing up all the LGM pixel values covered by the standard cell. LGM can also evaluate whether there are any particular weak points in a placement by finding the lowest LGM values covered by the standard cell.

For the design of a standard cell which is likely to be spatially repeated multiple times, the LGM can be used not only to guide the layout of the cell itself, but also to compute a favored pitch for the cell in the lithography sense. A design having a smaller favored pitch will be able to provide smaller circuit area, which can be significant if the cell is repeated many times.

Figure 6A:
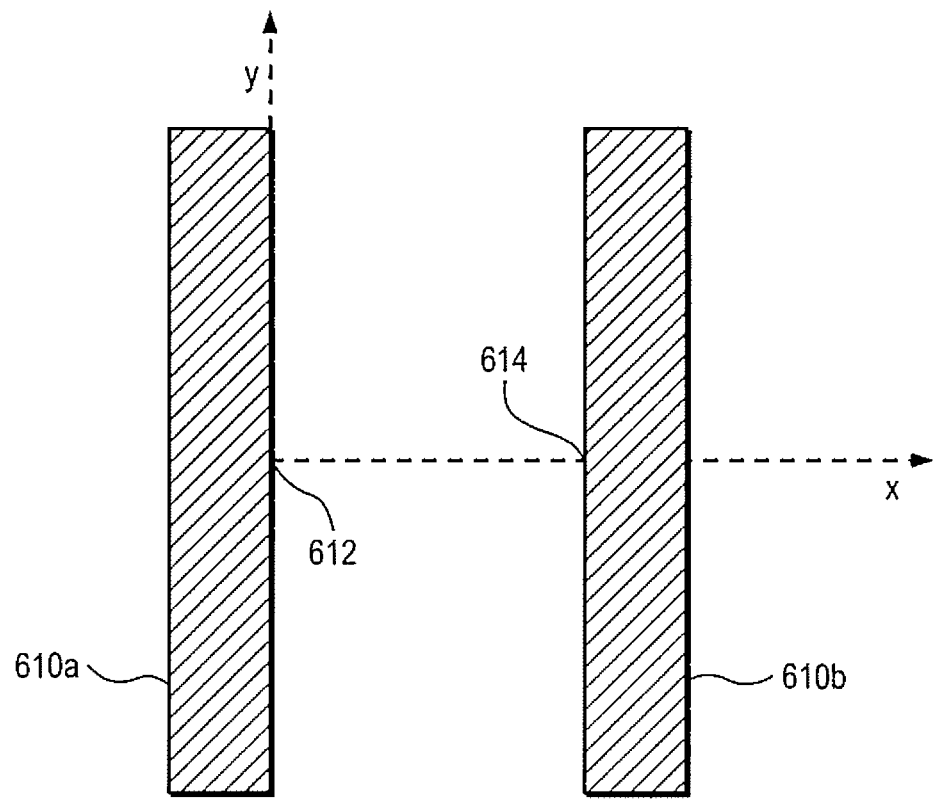
FIG. 6A is a diagram of one embodiment of test features and a coordinate system for generating SRAF placement rules using an SGM, according to the invention.

In one embodiment, an SGM can be used to create a set of SRAF placement rules. An example of a set of SRAF placement rules is shown below in Table 1. Column 1 identifies the type of pattern, where type 1 is an SRAF-favored pattern like a gate, and type 2 is an SRAF-non-favored pattern like a metal line. Column 2 identifies the space between the main features in the layout. There are three kinds of SRAF placement rules shown in Table 1. The first kind of rule (columns 3-6) is for placing SRAFs (i.e., scattering bars or SB) between the same type of patterns. The second kind of rule (columns 7-10) is for placing SRAFs between an SRAF-favored pattern and an SRAF-non-favored pattern. The third kind of rule (columns 11-14) is for placing SRAFs between an SRAF-favored or SRAF-disfavored pattern and a no-SRAF pattern (e.g., very large patterns). For contact layers, all three of kinds of rules may be the same. Each row of Table 1 specifies the number of SRAFs to be placed, the width of each SRAF, the space between the SRAF and the main feature, and the space between the SRAFs according to the space between the main features. For poly (metal) layer, the SRAF placement rules are created using the SGM and a series of one-dimensional test features.

which both the line test features and SRAFs are assumed to have infinite length as compared to their width. FIG. 6A shows two line test features 610a and 610b that are of the same type, e.g., both features are gates. Thus the following discussion describes generating the first kind of SRAF placement rules. The width of the line test features equals the most important line width of the layout and the space between any two neighboring line test features is the specified space value between main features. An SGM is then generated for this test pattern.

As shown in FIG. 6A, a coordinate system is imposed on the test patterns, where the y-axis coincides with the boundary of an arbitrary line test feature and the x-axis is perpendicular to the line test features. In FIG. 6A, x=0 (612) and x=space (614) correspond to the boundaries of neighboring line test features 610a and 610b. For the one-dimensional rule, the SGM value between any two neighboring line patterns S(x) is equal to SGM (x,0) and x=[0, 1, . . . space]. The SRAF placement rule generation problem for these line test features is then transformed into the problem of partitioning the interval [0, space] into n smaller intervals $[x_{1s}, x_{1e}]$, $[x_{2s}, x_{2e}]$, . . . $[x_{ns}, x_{ne}]$, where $0 \leq x_{1s} < x_{1e} < x_{2e} < x_{ns}$ . . . $< x_{ns} < x_{ne} \leq$ space. Each interval represents an SRAF such that the i-th SRAF ($1 \leq i \leq n$) can be described as $x_{is} \leq x \leq x_{ie}$.

Determining the optimal SRAF placement rule is equivalent to maximizing the total SGM value covered by SRAFs subject to MRC rules and SRAF printability constraints. Let $S_i$ be the SGM value covered by the i-th SRAF ($1 \leq i \leq n$), then the total SGM value covered by SRAFs is $$\sum_{i=1}^{n} S_i = \sum_{i=1}^{n} \sum_{x=x_{is}}^{x_{ie}} S(x)$$

There are five constraints on placing SRAFs in a layout:
1. minimum SRAF width ($W_{min}$), i.e., for any $i \in \{1, 2, \ldots, n\}$, $x_{ie} - x_{is} \geq W_{min}$
2. maximum SRAF width ($W_{max}$), i.e., for any $i \in \{1, 2, \ldots, n\}$, $x_{ie} - x_{is} \geq W_{min}$
3. minimum spacing between SRAF and main feature ($S_{main}$), i.e., $x_{1s} \geq S_{main}$ and $x_{ne} \leq$ space-$S_{main}$
4. minimum spacing between any two neighboring SRAFs ($S_{SRAF}$), i.e., for any $i \in \{2, \ldots, n\}$, $x_{is} - x_{(i-1)e} \geq S_{SRAF}$
5. for any $i \in \{1, 2, \ldots, n\}$. $S_i \geq 0$ (There is no need to place SRAFs with negative SGM value, even if its value is the largest possible).

TABLE 1

| Type | Space | # | SB Width | SP1 | SP2 | Cp # | cpSB width | cpSP1 | cpSP2 | Cp2 # | Cp2AF width | Cp2SP1 | CpSP2 |
|---|---|---|---|---|---|---|---|---|---|---|---|---|---|
| 1 | 330 | 1 | 40 | 0 | 0 | 0 | 0 | 0 | 0 | 0 | 0 | 0 | 0 |
| 1 | 500 | 2 | 40 | 145 | 0 | 0 | 0 | 0 | 0 | 2 | 40 | 145 | 120 |
| 1 | 650 | 3 | 40 | 145 | 0 | 0 | 0 | 0 | 0 | 2 | 40 | 145 | 120 |
| 1 | 820 | 4 | 40 | 145 | 120 | 0 | 0 | 0 | 0 | 0 | 0 | 0 | 0 |
| 2 | 330 | 1 | 40 | 0 | 0 | 0 | 0 | 0 | 0 | 0 | 0 | 0 | 0 |
| 2 | 500 | 2 | 40 | 145 | 0 | 0 | 0 | 0 | 0 | 2 | 40 | 145 | 120 |
| 2 | 650 | 3 | 40 | 145 | 0 | 0 | 0 | 0 | 0 | 2 | 40 | 145 | 120 |
| 2 | 820 | 4 | 40 | 145 | 120 | 0 | 0 | 0 | 0 | 0 | 0 | 0 | 0 |

FIG. 6A is a diagram of one embodiment of test features and a coordinate system for generating SRAF placement rules for poly (metal) layer using an SGM, according to the invention. For a specified space between main features, a test pattern composed of repetitive line test features is created, in Assuming the global optimal solution (partition) for [0,space] with constraints ($W_{min}$, $W_{max}$, $S_{main}$, $S_{SRAF}$) is Rule$_{opt}$ = $\{[x_{1s}, x_{1e}], [x_{2s}, x_{2e}], \ldots, [x_{ns}, x_{ne}]\}$, then the i-th SRAF ($1 \leq i \leq n$) covers $[x_{is}, x_{ie}]$. What is more, for any $i \in \{2, \ldots, n\}$, $\{[x_{1s}, x_{1e}], [x_{2s}, x_{2e}], \ldots [x_{(i-1)s}, x_{(i-1)e}]\}$ is also the optimal partition for [0, $x_{is}$–$S_{SRAF}$], with the same constraints (otherwise, if there exists a better partition for [0, $x_{is}$–$S_{SRAF}$], then it can be combined with the i, i+1, . . . , n-th SRAF placement in Rule$_{opt}$ and land at a rule that is better than Rule$_{opt}$ and still satisfies the constraints, which contradicts the optimality of Rule$_{opt}$).

Thus, the interval [0,space] is divided into smaller intervals and an algorithm is constructed based on dynamic programming. The summary of this algorithm follows, assuming space≥2S$_{main}$+W$_{min}$:
INPUT: space, S(X) for x=[0, 1, . . . , space], and constraints (W$_{min}$, W$_{max}$, S$_{main}$, S$_{SRAF}$)
Intermediate Results:
NumSRAFArray[x] (x=[0, 1, . . . , space-S$_{main}$]): an array which has a size of space-S$_{main}$+1 and NumSRAFArray[x] stores the number of SRAFs of the optimal partition for [0,x] SRAFSGMArray[x] (x=[0, 1, . . . , space-S$_{main}$]): an array which has a size of space-S$_{main}$+1 and SRAFSGMArray[x] stores the total SGM covered by SRAFs of the optimal partition for [0,x] SRAFLeftEndArray[x] (x=[0, 1, . . . , space-S$_{main}$]): an array which has a size of space-S$_{main}$+1 and SRAFLeftEndArray[x] stores the coordinate of the right most SRAF's left end of the optimal partition for [0,x] (corresponds to the largest $x_{is}$ such that $x_{ie}$≤x) SRAFRightEndArray[x] (x=[0, 1, . . . , space-S$_{main}$]): an array which has a size of space-S$_{main}$+1 and SRAFLeftEndArray[x] stores the coordinate of the right most SRAF's right end of the optimal partition for [0,x] (corresponds to the largest $x_{ie}$ such that $x_{ie}$≤x).
Initialization:
Set NumSRAFArray[x] and SRAFSGMArray[x] to zero for all x=[0, 1, . . . , space-S$_{main}$].
SRAF Computation:

```
For I = S_min + W_min to space-S_main STE P = 1 //For Constraint 3
    tempSGMValue←SRAFSGMArray[i-1]
    tempNumSRAF←NumSRAFArray[i-1]
    tempSRAFLeftEnd←SRAFLeftEndArray[i-1]
    tempSRAFRightEnd←SRAFRightEndArray[i-1]
```

$$\text{tempNewSRAFSGM} \leftarrow \sum_{k=i-W_{min}}^{i} S(k)$$

//Candidate SRAF's SGM value

```
    for j = i-Wmin to max {i-W_max, S_main}: STEP= -1
    //j: Candidate SRAF's left end.
    //The width of each SRAF is guaranteed to fall in [W_min, W_max]
        if(tempNewSRAFSGM ≥ 0)     //For Constraint 5
            h ← j-S_SRAF
            if (h ≥ S_main + W_min)
                PreviousSGMValue←SRAFSGMArray[h]
                PreviousNumSRAF← NumSRAFArray[h]
                //Optimal partition for [0, j-S_SRAF]
            else
                PreviousSGMValue← 0
                PreviousNumSRAF← 0
            End
            if(tempNewSRAFSGM+PreviousSGMValue>
            tempSGMValue)
                tempSGMValue← tempNewSRAFSGM+
                PreviousSGMValue
                tempNumSRAF← PreviousNumSRAF+ 1
                tempSRAFLeftEnd← j
                tempSRAFRightEnd← i
            End
        End
        tempNewSRAFSGM← tempNewSRAFSGM+S(j-1)
    End
    SRAFSGMArray[i] ← tempSGMValue
    NumSRAFArray[i] ← tempNumSRAF
    SRAFLeftEndArray[i] ← tempSRAFLeftEnd
    SRAFRightEndArray[i] ← tempSRAFRightEnd
    //Update all intermediate results
End
```

Output: NumSRAFArray[space-S$_{SRAF}$], SRAFLeftEndArray[x] (x=[0, I, . . . , space-S$_{RAF}$]), and SRAFRightEndArray [x] (x=[0, I, . . . , space-S$_{RAF}$])

Figure 6B:
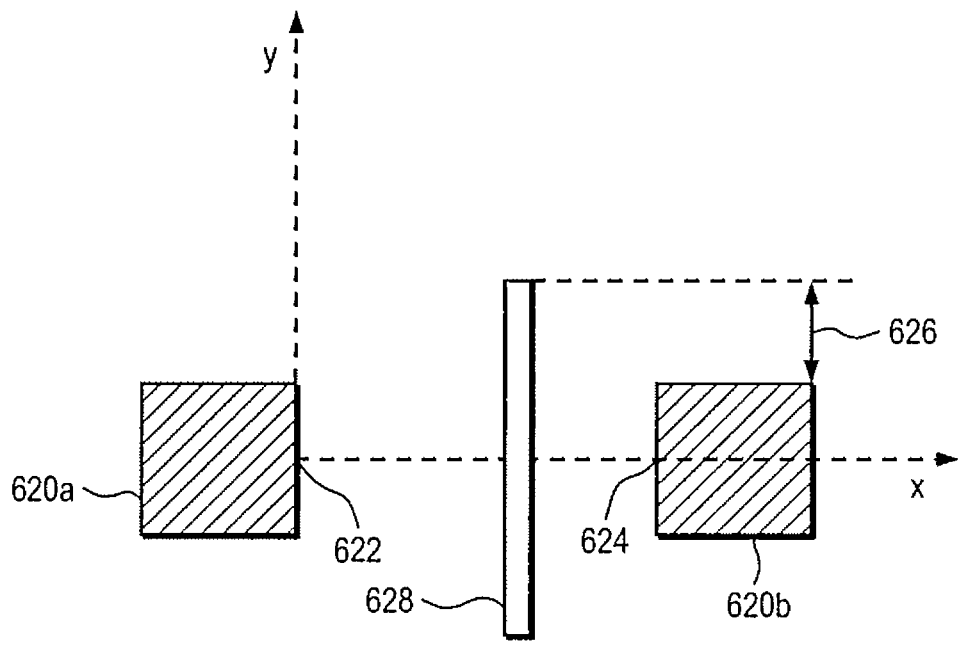
FIG. 6B is a diagram of one embodiment of test contact features and a coordinate system for generating SRAF placement rules using an SGM, according to the invention.

FIG. 6B is a diagram of one embodiment of contact test features and a coordinate system for generating SRAF placement rules using an SGM, according to the invention. The contact test features 620a and 620b are repetitive square features. Since the significance of each contact test feature 620a. 620b is identical, the following discussion describes generating the first kind of SRAF placement rules. The space between any two neighboring contacts is the specified space between main features. An SGM is generated for this test pattern. A coordinate system is imposed on the contact test features, where the y-axis coincides with the boundary of an arbitrary contact test feature, the origin is located at the middle of that edge of the contact test feature. In FIG. 6B, x=0 (622) and x=space (624) correspond to the boundaries of neighboring contact test features 620a and 620b.

For a contact layer, the length of a main feature is typically the same as the width, thus two-dimensional effects caused by the finite length of the feature are considered. For SRAFs placed in a contact layer, the SRAF length is specified by a parameter "sbEndExtension" 626. If the length of contact test features 620a, 620b is L, then the length of an SRAF 628 is L+2*sbEndExtension. Since only the SGM value covered by SRAFs is of interest, the SGM value function S(x) is redefined as:

$$S(x) = \sum_{y=L/2-sbEndExtension}^{L/2+sbEndExtension} SGM(x, y) \text{ for } x = [0, 1, \ldots, space]$$

Determining the first type of SRAF placement rules for contacts is the same as described above for line features, except for the different definition of S(x).

Determining the second kind of SRAF placement rules (i.e. rules for placing SRAFs between SRAF-favored patterns and SRAF-non-favored patterns) is similar to determining the first kind of SRAF placement rules except that different weights are assigned to neighboring patterns. For example, an edge of an SRAF-favored pattern will be assigned a higher weight than an edge of an SRAF-non-favored pattern.

Figure 6C:
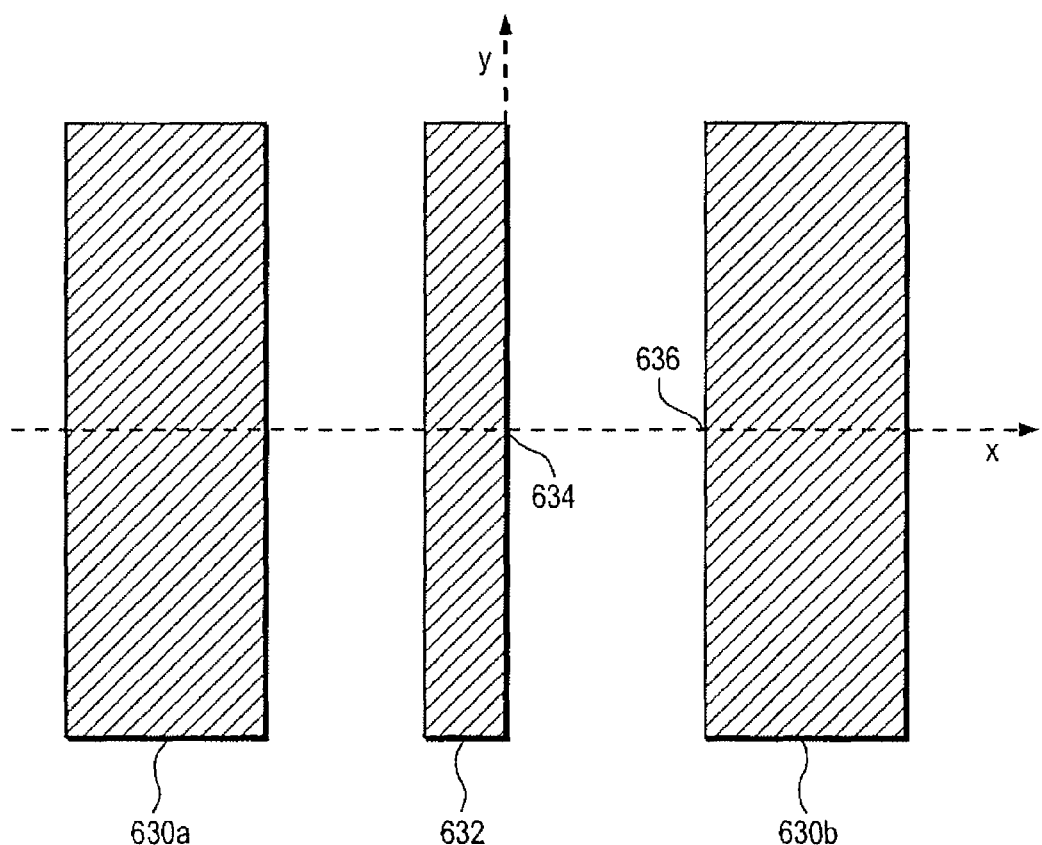
FIG. 6C is a diagram of one embodiment of test features and a coordinate system for generating SRAF placement rules using an SGM, according to the invention.

FIG. 6C is a diagram of one embodiment of test features and a coordinate system for generating SRAF placement rules using an SGM, according to the invention. The test features of FIG. 6C are used to determine the third kind of SRAF placement rules (i.e., rules for placing SRAFs between an SRAF-favored feature or SRAF-non-favored feature and a no-SRAF feature). A central line test feature 632 has width of the most important line width in the design layout and line test features 630a and 630b (no-SRAF features) are assumed to be infinitely wide. The SRAF placement rules are determined as described above in conjunction with FIG. 6A, except that line test feature 632 is assigned a large weight, and line test features 630a, 630b are assigned a very small weight.

After SRAFs are placed according to the placement rules, the placement, width, and length of each SRAF can be fine-tuned using the SGM to account for the 2D effects of the mask layout. For poly (metal) layer, the SRAF placement rule is generated with the assumption that the main features' length is much larger than their width. However, this assumption is not always valid. For example, for areas near line-ends, the SGM may indicate that a placed SRAF should be slightly wider than the width dictated by the rule. This SRAF may then be thickened. The SGM value covered by each SRAF can also be used as the SRAF's priority to resolve potential conflicts. For example, if SRAFs from different main feature segments overlap, the SRAF with lower priority is modified first to remove the overlap.

Figure 7:
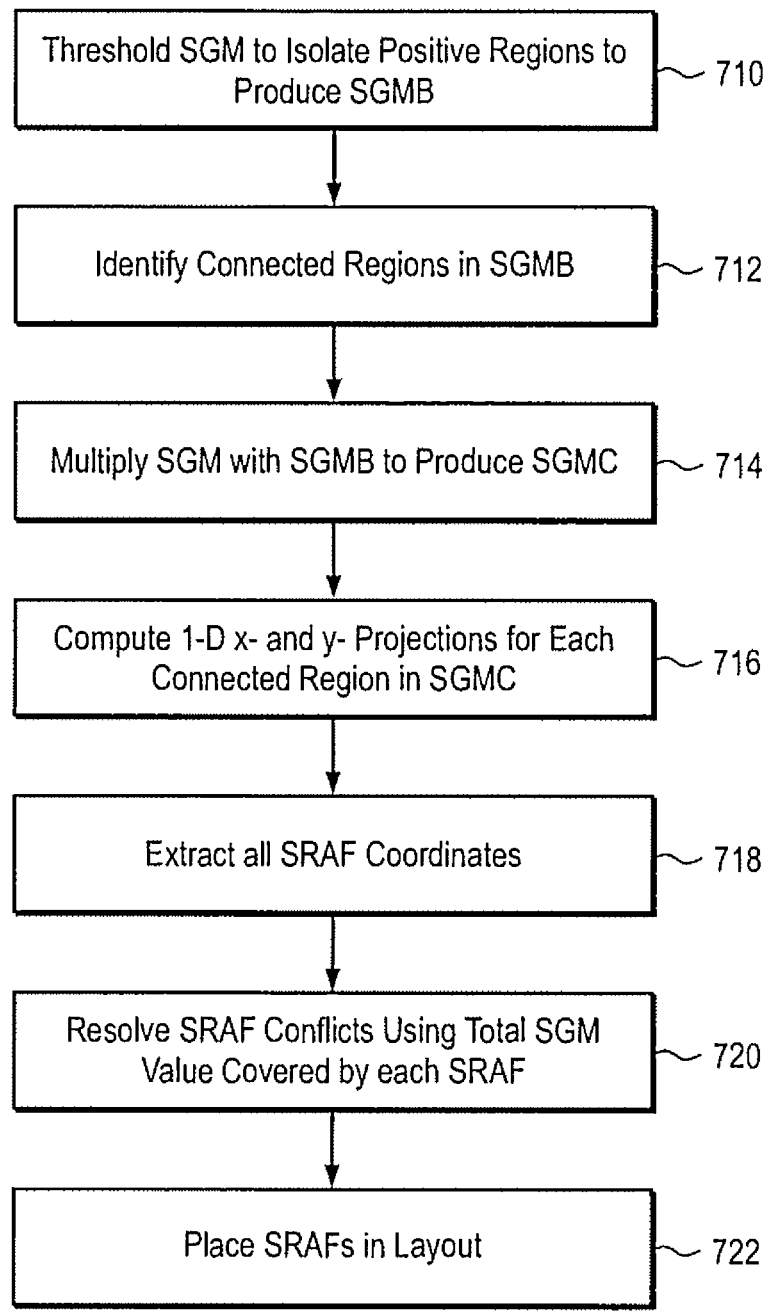
FIG. 7 is a flowchart of method steps for rule-free placement of SRAFs using an SGM, according to one embodiment of the invention.

FIG. 7 is a flowchart of method steps for rule-free placement of SRAFs using an SGM, according to one embodiment of the invention. In the FIG. 7 embodiment, SRAFs are derived directly from the SGM, instead of first generating SRAF placement rules. In this embodiment, regions of the SGM are converted into SRAF polygons. Each SRAF polygon is required to be a thin bar shape, to be oriented either horizontally or vertically, and to have a width within the range $[W_{min}, W_{max}]$.

In step 710, the SGM is thresholded to identify the positive regions, i.e., the regions where SRAFs are desired. The thresholding produces a binary image, SGMB. In step 712, standard image processing methods are used to identify connected positive regions within the SGMB. In step 714, the SBM is multiplied by the SGMB to produce SGMC, such that each positive pixel of the SGMB is assigned its corresponding value in the SGM. In step 716, one-dimensional x- and y-projections of the SGMC are computed for each connected region. In step 718, all of the SRAF coordinates (i.e., locations where all SRAFs should be placed) are extracted by applying the above-described dynamic programming approach for rule generation to the one-dimensional projections. In step 720, any conflicts between placing SRAFs are resolved using the total SGM value covered by each SRAF as its priority. Possible conflicts between placing SRAFs include the minimum allowed end-to-end distance between SRAFs and the minimum allowed corner-to-corner distance between SRAFs. In step 722, the SRAFs are placed in the layout.

Figure 8:
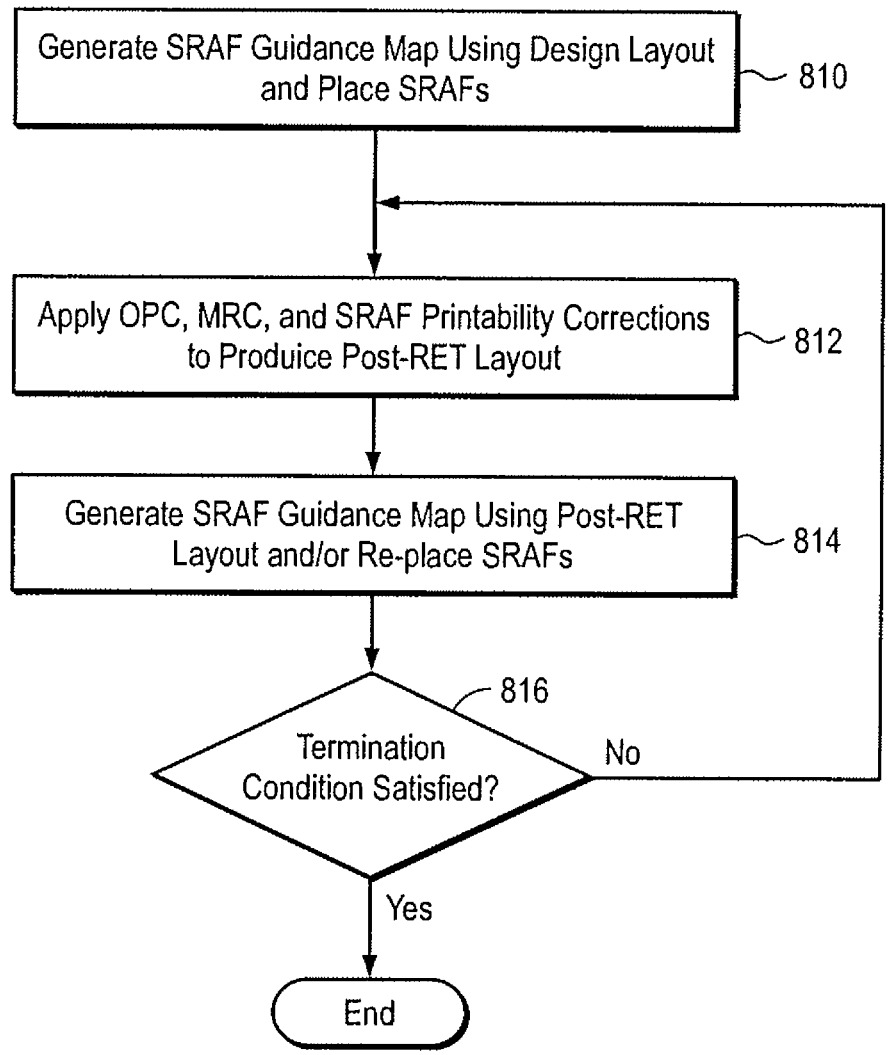
FIG. 8 is a flowchart of method steps for integrating model-based SRAF generation with applying OPC corrections, according to one embodiment of the invention.

FIG. 8 is a flowchart of method steps for integrating model-based SRAF generation with applying OPC corrections, according to one embodiment of the invention. Typically, OPC correction image data ($M^C$) is quite small compared to the pre-OPC mask image data ($M^T$), so the post-OPC mask image $M^K(x)=M^T(x)+M^C(x)\approx M^T(x)$ and the SGM only depends on the pre-OPC layout. Thus the SGM can be generated and SRAFs placed in the layout before OPC corrections are applied. However, if the OPC corrections cannot be ignored, the SGM generation and SRAF placement can be integrated with the application of OPC corrections.

In step 810, the SGM is first generated using the design (pre-OPC) layout and SRAFs are placed in the design layout using either placement rules generated using the SGM or directly from the SGM, as described above. In step 812, OPC, mask rule check (MRC), and SRAF printability corrections are applied to the design layout with the SRAFs. In step 814, a new SGM is generated using the post-OPC layout and/or the SRAFs are replaced in the post-OPC layout. Regenerating the SGM in step 814 is optional. In step 816, if the termination condition is satisfied, the method ends, but if the termination condition is not satisfied, the method returns to step 812 where another iteration of the OPC, MRC, and SRAF printability corrections is applied. The termination condition can be a maximum iteration number or a determination of whether a simulated resist image contour is sufficiently close to the design target.

Adjusting the placement of SRAFs after each iteration of OPC and other corrections can be quite efficient. For example, after one iteration of OPC corrections, certain SRAFs may not be placed in accordance with the SGM because of MRC constraints such not being as wide as desired or not being able to be placed at all. However, after another iteration of OPC corrections, there may be room for these SRAFs to be placed.

Figure 9:
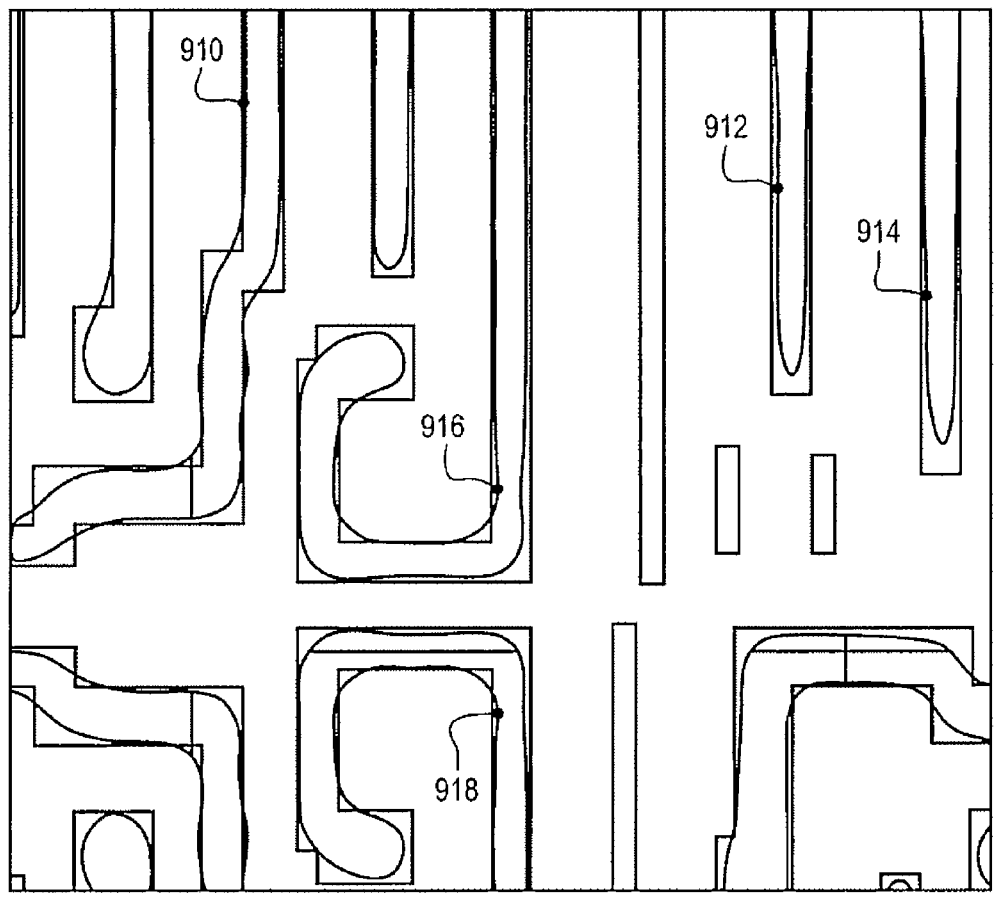
FIG. 9 is a diagram showing critical dimensions of features in a layout after application of a prior art SRAF placement rule.

FIG. 9 is a diagram showing a design target layout with SRAFs that were placed according to prior art SRAF placement rules. FIG. 9 also shows simulated resist contours for the post-OPC layout. The critical dimension (i.e., line width) measured at hot spot 910 is 49.6 nm, at hot spot 912 the critical dimension is 40 nm, at hot spot 914 the critical dimension is 44 nm, at hot spot 916 the critical dimension is 29.3 nm, and at hot spot 918 the critical dimension is 35.5 nm. Hot spot 916 especially shows what is known as "necking," where the simulated resist contour is much narrower than the designed-for line width.

Figure 10:
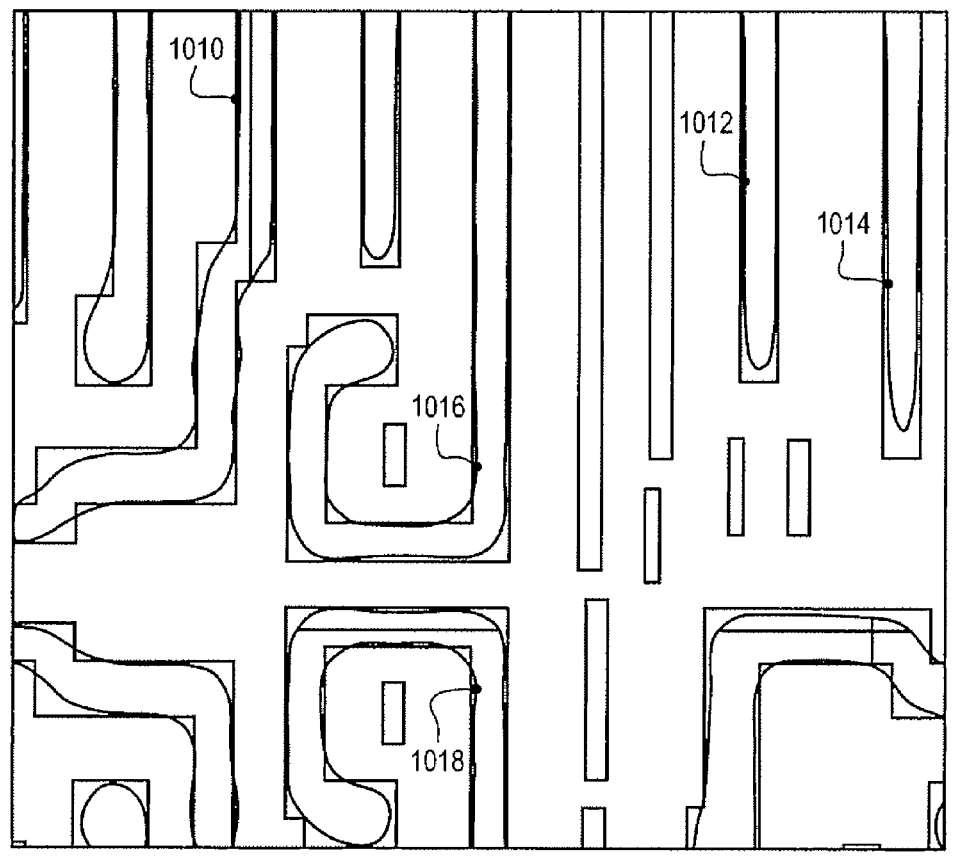
FIG. 10 is a diagram showing critical dimensions of features in a layout after application of SRAF placement rules created using an SGM, according to one embodiment of the invention.

FIG. 10 is a diagram showing the same design target layout with SRAFs that were placed according to SRAF placement rules created using an SGM. FIG. 10 also shows simulated resist contours for this post-OPC layout. The critical dimension measured at hot spot 1010 is 49.77 nm, at hot spot 1012 the critical dimension is 47.44 nm, at hot spot 1014 the critical dimension is 44.75 nm, at hot spot 1016 the critical dimension is 41.24 nm, and at hot spot 1018 the critical dimension is 40.72 nm. As seen in comparing the measured critical dimensions in FIG. 9 and FIG. 10, the post-OPC layout having SRAFs placed using the SGM results in simulated resist contours that better match the layout and improved critical dimensions at hot spots.

The SGM may be used in other applications other than placing SRAFs. The SGM may be used to identify hot spots in the pre-OPC (design target) layout. If a main feature resides in an area that has a very low SGM value computed without this feature, the feature will adversely affect the process window of the edges of neighboring patterns and the overall process window robustness of the design. The SGM may also be used to repair hot spots by shifting the hot spots to an area with a higher SGM value. The SGM may be used in a double exposure design, where the full chip design is separated into two groups of patterns that are exposed in sequence. In separating all the patterns into two groups, some patterns are ambiguous, i.e., the pattern does not violate any rule if it is placed in either group. For such patterns, the SGM may be used to decide in which group the pattern should be placed by selecting the layout with the higher SGM value. The SGM may also be used to determine overall bias rules for a layout, i.e., how much a pattern should enlarge or shrink.

Additional Descriptions of Certain Aspects of the Invention

Certain embodiments of the invention provide systems and methods for placing sub-resolution assist features in a mask layout. Some of these embodiments comprise generating an SRAF guidance map for the mask layout, wherein the SRAF guidance map is an image in which each pixel value indicates whether the pixel would contribute positively to edge behavior of features in the mask layout if the pixel is included as part of a sub-resolution assist feature and placing sub-resolution assist features in the mask layout according to the SRAF guidance map. In some of these embodiments, generating an SRAF guidance map comprises computing an image gradient map of the mask layout, for each field point in the mask layout, computing a total vote sum for a unit source at the field point using the image gradient map and assigning values in the SRAF guidance map, wherein the value at a pixel in the SRAF guidance map is the total vote sum at a corresponding field point in the mask layout. In some of these embodiments, computing a total vote sum for a unit source at the field point is performed in the frequency domain and includes computing the inverse Fourier Transform of a most significant eigenvector of transmission cross-coefficients that represent the optical path of an exposure tool, computing the Fourier Transform of the mask layout, multiplying the inverse Fourier Transform by the sum square of frequency and the Fourier Transform of the mask layout to produce a product, and computing the inverse Fourier Transform of the product to produce the SRAF guidance map. In some of these embodiments, wherein generating an SRAF guidance map comprises computing a bilinear SRAF guidance map kernel using the transmission cross-coefficients that represent the optical path of an exposure tool, computing a linear SRAF guidance map kernel using the transmission cross-coefficients, computing a partial SRAF guidance map using the bilinear SRAF guidance map kernel and the mask layout, computing a second partial SRAF guidance map using the linear SRAF guidance map kernel and the mask layout, and combining the partial SRAF guidance map and the second partial SRAF guidance map. In some of these embodiments, the methods and systems may comprise generating SRAF placement rules using the SRAF guidance map. In some of these embodiments, the mask layout includes optical proximity corrections. In some of these embodiments, the methods may be stored on a computer-readable medium as instructions for execution on a computing device.

Some of these embodiments further comprise or generate mask layout data including sub-resolution assist features, wherein the sub-resolution assist features were placed according to an SRAF guidance map, wherein the SRAF guidance map is an image in which each pixel value indicates whether the pixel would contribute positively to edge behavior of features in the mask layout if the pixel is included as part of a sub-resolution assist feature. In some of these embodiments, the SRAF guidance map was generated by computing the inverse Fourier Transform of a most significant eigenvector of transmission cross coefficients that represent the optical path of an exposure tool, computing the Fourier Transform of the mask layout, multiplying the inverse Fourier Transform by the sum square of frequency and the Fourier Transform of the mask layout to produce a product, and computing the inverse Fourier Transform of the product to produce the SRAF guidance map. In some of these embodiments, the initial mask layout includes optical proximity corrections. In some of these embodiments, the SRAF guidance map was generated by computing a bilinear SRAF guidance map kernel using the transmission cross-coefficients that represent the optical path of an exposure tool, computing a linear SRAF guidance map kernel using the transmission cross-coefficients, computing a partial SRAF guidance map using the bilinear SRAF guidance map kernel and the mask layout, computing a second partial SRAF guidance map using the linear SRAF guidance map kernel and the mask layout, and combining the partial SRAF guidance map and the second partial SRAF guidance map. In some of these embodiments, the initial mask layout includes optical proximity corrections.

Some of these embodiments further comprise or generate a mask having a mask layout that includes sub-resolution assist features, wherein the sub-resolution assist features were placed according to an SRAF guidance map, wherein the SRAF guidance map is an image in which each pixel value indicates whether the pixel would contribute positively to through-focus and through-dose edge behavior of features in the mask layout if the pixel is included as part of a sub-resolution assist feature. In some of these embodiments, the SRAF guidance map was generated by computing the inverse Fourier Transform of a most significant eigenvector of transmission cross-coefficients that represent the optical path of an exposure tool, computing the Fourier Transform of the mask layout, multiplying the inverse Fourier Transform by the sum square of frequency and the Fourier Transform of the mask layout to produce a product, and computing the inverse Fourier Transform of the product to produce the SRAF guidance map. In some of these embodiments, the initial mask layout includes optical proximity corrections. In some of these embodiments, the SRAF guidance map was generated by computing a bilinear SRAF guidance map kernel using the transmission cross-coefficients that represent the optical path of an exposure tool, computing a linear SRAF guidance map kernel using the transmission cross-coefficients, computing a partial SRAF guidance map using the bilinear SRAF guidance map kernel and the mask layout, computing a second partial SRAF guidance map using the linear SRAF guidance map kernel and the mask layout, and combining the partial SRAF guidance map and the second partial SRAF guidance map. In some of these embodiments, the initial mask layout includes optical proximity corrections.

Certain embodiments of the invention, including certain of the latter embodiments, provide systems and methods for determining location of one or more features within a mask layout, comprising placing a first feature in the mask layout, performing a mask simulation based on the placement of the first feature, wherein performing the mask simulation includes generating an SRAF guidance map and determining a location for placing a second feature in the mask layout based on results obtained from the simulation. Some of these embodiments further comprise placing the second feature at the determined location and iteratively repeating the steps of performing a mask simulation based on previously placed features, determining the location for placing another feature within the mask layout and placing the another feature until a desired number of features has been placed in the mask design. Some of these embodiments further comprise optimizing the mask layout using OPC. Some of these embodiments further comprise optimizing the mask layout using resolution enhancement techniques. Some of these embodiments further comprise a plurality of layout guidance maps, wherein each layout guidance map is representative of simulated imaging performance of a mask layout. In some of these embodiments, each LGM comprises a two-dimensional image including a plurality of pixel values, the placement of a feature is calculated based on one or more of the pixel values. In some of these embodiments, each of the pixel values is indicative of the effect on printability of one or more patterns in the mask layout of a portion of the feature placed on the pixel. In some of these embodiments, the effect on printability is a negative effect. In some of these embodiments, the portion of the feature placed on the pixel enhances printability of the one or more patterns.

The invention has been described above with reference to specific embodiments. It will, however, be evident that various modifications and changes may be made thereto without departing from the broader spirit and scope of the invention as set forth in the appended claims. The foregoing description and drawings are, accordingly, to be regarded in an illustrative rather than a restrictive sense.

What is claimed is:

1. A method for placing sub-resolution assist features ("SRAF") in a mask layout, comprising:
    generating an SRAF guidance map for the mask layout, wherein the SRAF guidance map is an image in which each pixel value indicates whether the pixel would contribute positively to edge behavior of features in the mask layout if the pixel is included as part of a sub-resolution assist feature; and placing sub-resolution assist features in the mask layout according to the SRAF guidance map, wherein the generating and the placing are performed by using a computer, and wherein generating an SRAF guidance map comprises:
computing an image gradient map of the mask layout; and
for each field point in the mask layout, computing a total vote sum for a unit source at the field point using the image gradient map.

2. The method of claim 1, wherein generating an SRAF guidance map comprises:
assigning values in the SRAF guidance map, wherein the value at a pixel in the SRAF guidance map is the total vote sum at a corresponding field point in the mask layout.

3. The method of claim 2, wherein computing a total vote sum for a unit source at the field point is performed in the frequency domain and includes:
computing the inverse Fourier Transform of a most significant eigenvector of transmission cross-coefficients that represent the optical path of an exposure tool;
computing the Fourier Transform of the mask layout;
multiplying the inverse Fourier Transform by the sum square of frequency and the Fourier Transform of the mask layout to produce a product; and
computing the inverse Fourier Transform of the product to produce the SRAF guidance map.

4. The method of claim 1, wherein generating an SRAF guidance map comprises:
computing a bilinear SRAF guidance map kernel using the transmission cross-coefficients that represent the optical path of an exposure tool;
computing a linear SRAF guidance map kernel using the transmission cross-coefficients;
computing a partial SRAF guidance map using the bilinear SRAF guidance map kernel and the mask layout;
computing a second partial SRAF guidance map using the linear SRAF guidance map kernel and the mask layout; and
combining the partial SRAF guidance map and the second partial SRAF guidance map.

5. The method of claim 1, further comprising generating SRAF placement rules using the SRAF guidance map.

6. The method of claim 1, wherein the mask layout includes optical proximity corrections.

7. A non-transitory computer-readable storage medium including instructions for performing:
generating an SRAF guidance map for the mask layout, wherein the SRAF guidance map is an image in which each pixel value indicates whether the pixel would contribute positively to edge behavior of features in the mask layout if the pixel is included as part of a sub-resolution assist feature; and
placing sub-resolution assist features in the mask layout according to the SRAF guidance map,
wherein the instructions are executed by a computer, and
wherein generating an SRAF guidance map comprises:
computing an image gradient map of the mask layout; and
for each field point in the mask layout, computing a total vote sum for a unit source at the field point using the image gradient map.

8. The computer-readable storage medium of claim 7, wherein generating an SRAF guidance map comprises:
assigning values in the SRAF guidance map, wherein the value at a pixel in the SRAF guidance map is the total vote sum at a corresponding field point in the mask layout.

9. The computer-readable storage medium of claim 8, wherein computing a total vote sum for a unit source at the field point is performed in the frequency domain and includes:
computing the inverse Fourier Transform of a most significant eigenvector of transmission cross coefficients that represent the optical path of an exposure tool;
computing the Fourier Transform of the mask layout;
multiplying the inverse Fourier Transform by the sum square of frequency and the Fourier Transform of the mask layout to produce a product; and
computing the inverse Fourier Transform of the product to produce the SRAF guidance map.

10. The computer-readable storage medium of claim 7, wherein generating an SRAF guidance map comprises:
computing a bilinear SRAF guidance map kernel using the transmission cross-coefficients that represent the optical path of an exposure tool;
computing a linear SRAF guidance map kernel using the transmission cross-coefficients;
computing a partial SRAF guidance map using the bilinear SRAF guidance map kernel and the mask layout;
computing a second partial SRAF guidance map using the linear SRAF guidance map kernel and the mask layout; and
combining the partial SRAF guidance map and the second partial SRAF guidance map.

11. The computer-readable storage medium of claim 7, further comprising generating SRAF placement rules using the SRAF guidance map.

12. The computer-readable storage medium of claim 7, wherein the mask layout includes optical proximity corrections.

13. A method for generating mask layout data, comprising:
including sub-resolution assist features in the mask layout data, wherein the sub-resolution assist features were placed according to an SRAF guidance map, wherein the SRAF guidance map is an image in which each pixel value indicates whether the pixel would contribute positively to edge behavior of features in the mask layout if the pixel is included as part of a sub-resolution assist feature, wherein generating an SRAF guidance map is generated by computing an image gradient map of the mask layout and, for each field point in the mask layout, computing a total vote sum for a unit source at the field point using the image gradient map.

14. The method for generating mask layout data of claim 13, wherein the SRAF guidance map is generated by:
computing the inverse Fourier Transform of a most significant eigenvector of transmission cross coefficients that represent the optical path of an exposure tool;
computing the Fourier Transform of the mask layout;
multiplying the inverse Fourier Transform by the sum square of frequency and the Fourier Transform of the mask layout to produce a product; and
computing the inverse Fourier Transform of the product to produce the SRAF guidance map.

15. The method for generating mask layout data of claim 14, wherein the initial mask layout includes optical proximity corrections.

16. A mask having a mask layout that includes sub-resolution assist features, wherein the sub-resolution assist features were placed according to an SRAF guidance map, wherein the SRAF guidance map is an image in which each pixel value indicates whether the pixel would contribute positively to through-focus and through-dose edge behavior of features in the mask layout if the pixel is included as part of a sub-resolution assist feature, wherein generating an SRAF guidance map is generated by computing an image gradient map of the mask layout and, for each field point in the mask layout, computing a total vote sum for a unit source at the field point using the image gradient map.

* * * * *

UNITED STATES PATENT AND TRADEMARK OFFICE
CERTIFICATE OF CORRECTION

PATENT NO. : 8,732,625 B2
APPLICATION NO. : 12/663121
DATED : May 20, 2014
INVENTOR(S) : Jun Ye et al.

It is certified that error appears in the above-identified patent and that said Letters Patent is hereby corrected as shown below:

On Title Page, Item (60) Related U.S. Application Data
  replace "Provisional application No. 60/935,713, filed on Aug. 28, 2007"
  with --U.S. Application No. 11/757,805, filed on June 4, 2007 and Provisional Application
     No. 60/935,713, filed on Aug. 28, 2007--.

Signed and Sealed this
Fifth Day of May, 2015

Michelle K. Lee
*Director of the United States Patent and Trademark Office*